US012745642B2

(12) United States Patent
Elsherbini et al.

(10) Patent No.: US 12,745,642 B2
(45) Date of Patent: Sep. 22, 2026

(54) DEVICE, METHOD, AND SYSTEM TO MITIGATE WARPAGE OF A COMPOSITE CHIPLET

(71) Applicant: Intel Corporation, Santa Clara, CA (US)

(72) Inventors: Adel Elsherbini, Chandler, AZ (US); Lance C. Hibbeler, Tillamook, OR (US); Omkar Karhade, Chandler, AZ (US); Chytra Pawashe, Portland, OR (US); Kimin Jun, Portland, OR (US); Feras Eid, Chandler, AZ (US); Shawna Liff, Scottsdale, AZ (US); Mohammad Enamul Kabir, Portland, OR (US); Bhaskar Jyoti Krishnatreya, Hillsboro, OR (US); Tushar Talukdar, Wilsonville, OR (US); Wenhao Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 89 days.

(21) Appl. No.: 17/891,690

(22) Filed: Aug. 19, 2022

(65) Prior Publication Data

US 2024/0063143 A1 Feb. 22, 2024

(51) Int. Cl.
*H10W 42/00* (2026.01)
*H10W 72/00* (2026.01)
(Continued)

(52) U.S. Cl.
CPC ......... *H10W 42/121* (2026.01); *H10W 90/00* (2026.01); *H10W 72/823* (2026.01);
(Continued)

(58) Field of Classification Search
CPC ....... H01L 23/562; H01L 24/08; H01L 24/80; H01L 25/0657; H01L 25/50;
(Continued)

(56) References Cited

U.S. PATENT DOCUMENTS 5,272,104 A 12/1993 Schrantz et al.
6,211,463 B1 4/2001 Fabis
(Continued)

FOREIGN PATENT DOCUMENTS

CN 205039151 2/2016
CN 205039151 U * 2/2016 ............ H01L 24/96
CN 111627887 9/2020

OTHER PUBLICATIONS

Office Action from European Patent Application No. 23185988.5 notified Dec. 23, 2024, 8 pgs.
(Continued)

*Primary Examiner* — Thanh T Nguyen
(74) *Attorney, Agent, or Firm* — Essential Patents Group, LLP

(57) ABSTRACT

Techniques and mechanisms to mitigate warping of a composite chiplet. In an embodiment, multiple via structures each extend through an insulator material in one of multiple levels of a composite chiplet. The insulator material extends around an integrated circuit (IC) component in the level. For a given one of the multiple via structures, a respective annular structure extends around the via structure to mitigate a compressive (or tensile) stress due to expansion (or contraction) of the via structure. In another embodiment, the composite chiplet additionally or alternatively comprises a structural support layer on the multiple levels, wherein the structural support layer has formed therein or thereon dummy via structures or a warpage compensation film.

14 Claims, 10 Drawing Sheets

(51) Int. Cl.
*H10W 80/00* (2026.01)
*H10W 90/00* (2026.01)
*H10W 90/20* (2026.01)

(52) U.S. Cl.
CPC ........ *H10W 80/312* (2026.01); *H10W 80/327* (2026.01); *H10W 90/291* (2026.01); *H10W 90/792* (2026.01)

(58) Field of Classification Search
CPC . H01L 2224/08145; H01L 2224/80895; H01L 2224/80896; H01L 2225/06548; H01L 2225/06582; H01L 2924/3511; H01L 24/17; H01L 2225/06513; H01L 23/16; H01L 23/20; H01L 23/315; H01L 25/18; H01L 24/19; H01L 24/20; H01L 25/0652; H10W 42/121; H10W 90/00; H10W 72/823; H10W 80/312; H10W 80/327; H10W 90/291; H10W 90/792; H10W 80/00; H10W 70/09; H10W 70/60; H10W 72/90; H10W 90/722; H10W 72/20; H10W 74/124; H10W 76/40; H10W 76/43
See application file for complete search history.

(56) References Cited

U.S. PATENT DOCUMENTS

| | | | |
|---|---|---|---|
| 6,486,954 | B1 | 11/2002 | Mieher et al. |
| 6,570,362 | B1 | 5/2003 | Estes et al. |
| 7,030,772 | B1 | 4/2006 | Lee et al. |
| 8,584,061 | B2 | 11/2013 | Shibata et al. |
| 9,219,042 | B2 | 12/2015 | Paek et al. |
| 9,275,929 | B2 | 3/2016 | Liou et al. |
| 9,324,698 | B2 | 4/2016 | Yu et al. |
| 9,368,479 | B2 | 6/2016 | Katkar et al. |
| 9,396,997 | B2 | 7/2016 | Hirler et al. |
| 9,418,967 | B2 | 8/2016 | Koshiishi et al. |
| 9,570,399 | B2 | 2/2017 | Yang et al. |
| 9,589,945 | B2 | 3/2017 | Jo et al. |
| 9,978,694 | B2 | 5/2018 | Cho et al. |
| 10,026,715 | B2 | 7/2018 | Kume et al. |
| 10,157,892 | B1 | 12/2018 | Chen et al. |
| 10,276,544 | B2 | 4/2019 | Matsumoto et al. |
| 10,290,571 | B2 | 5/2019 | Yu et al. |
| 10,312,201 | B1 | 6/2019 | Hu et al. |
| 10,347,598 | B2 | 7/2019 | Baek et al. |
| 10,381,298 | B2 | 8/2019 | Yu et al. |
| 10,381,326 | B2 | 8/2019 | Woychik et al. |
| 10,510,650 | B2 | 12/2019 | Yu et al. |
| 11,094,672 | B2 | 8/2021 | Elsherbini et al. |
| 11,195,817 | B2 | 12/2021 | Huang et al. |
| 11,387,222 | B2 | 7/2022 | Yu et al. |
| 12,068,234 | B2 | 8/2024 | Chen et al. |
| 12,272,568 | B2 | 4/2025 | Chen et al. |
| 2002/0074649 | A1 | 6/2002 | Chrysler et al. |
| 2002/0141155 | A1 | 10/2002 | Pinneo |
| 2006/0043367 | A1 | 3/2006 | Chang et al. |
| 2006/0113546 | A1 | 6/2006 | Sung |
| 2008/0246126 | A1 | 10/2008 | Bowles et al. |
| 2009/0134500 | A1 | 5/2009 | Kuo |
| 2009/0174050 | A1 | 7/2009 | Bernstein et al. |
| 2012/0061827 | A1 | 3/2012 | Fujita |
| 2013/0134548 | A1 | 5/2013 | Torii |
| 2013/0139524 | A1 | 6/2013 | Kim et al. |
| 2013/0221493 | A1 | 8/2013 | Kim et al. |
| 2013/0250527 | A1 | 9/2013 | Hatanaka et al. |
| 2014/0070407 | A1 | 3/2014 | Lee et al. |
| 2014/0231815 | A1 | 8/2014 | Railkar et al. |
| 2014/0264772 | A1 | 9/2014 | Horng et al. |
| 2014/0293543 | A1 | 10/2014 | Kim et al. |
| 2015/0200153 | A1 | 7/2015 | Wang et al. |
| 2016/0093533 | A1 | 3/2016 | Yow et al. |
| 2017/0084544 | A1 | 3/2017 | Chen |
| 2017/0092561 | A1 | 3/2017 | Eid et al. |
| 2017/0207197 | A1 | 7/2017 | Yu et al. |
| 2017/0213766 | A1 | 7/2017 | Kitayama |
| 2018/0158744 | A1 | 6/2018 | Song et al. |
| 2018/0158749 | A1 | 6/2018 | Yu et al. |
| 2018/0240756 | A1 | 8/2018 | Foo et al. |
| 2019/0051612 | A1 | 2/2019 | Kim et al. |
| 2019/0096868 | A1 | 3/2019 | Tsou et al. |
| 2019/0103390 | A1 | 4/2019 | Chen et al. |
| 2019/0139896 | A1 | 5/2019 | Hsu et al. |
| 2019/0244947 | A1 | 8/2019 | Yu et al. |
| 2019/0393190 | A1 | 12/2019 | Delacruz et al. |
| 2019/0393192 | A1 | 12/2019 | Eid et al. |
| 2019/0393193 | A1 | 12/2019 | Eid et al. |
| 2020/0091029 | A1 | 3/2020 | Jeng et al. |
| 2020/0105639 | A1 | 4/2020 | Valavala et al. |
| 2020/0185330 | A1 | 6/2020 | Yu et al. |
| 2020/0211920 | A1 | 7/2020 | Lee et al. |
| 2020/0312741 | A1 | 10/2020 | Wan et al. |
| 2020/0312774 | A1 | 10/2020 | Yu et al. |
| 2020/0335480 | A1 | 10/2020 | Hwang et al. |
| 2021/0020601 | A1 | 1/2021 | Chen et al. |
| 2021/0066279 | A1 | 3/2021 | Yu et al. |
| 2021/0096311 | A1 | 4/2021 | Yu et al. |
| 2021/0098422 | A1 | 4/2021 | Elsherbini et al. |
| 2021/0118756 | A1 | 4/2021 | Wan et al. |
| 2021/0118770 | A1 | 4/2021 | Kuo et al. |
| 2021/0159179 | A1 | 5/2021 | Elsherbini et al. |
| 2021/0193567 | A1 | 6/2021 | Cheah et al. |
| 2021/0375830 | A1 | 12/2021 | Elsherbini |
| 2021/0407932 | A1 | 12/2021 | Kabir et al. |
| 2022/0037281 | A1 | 2/2022 | Elsherbini et al. |
| 2022/0157691 | A1 | 5/2022 | Sharfi et al. |
| 2022/0310411 | A1 | 9/2022 | Chen et al. |
| 2022/0310501 | A1 | 9/2022 | Wang et al. |
| 2023/0067349 | A1 | 3/2023 | Lin et al. |
| 2023/0115745 | A1 | 4/2023 | Wang et al. |
| 2023/0154825 | A1 | 5/2023 | Tong |
| 2023/0369070 | A1 | 11/2023 | Ho et al. |
| 2024/0008184 | A1 | 1/2024 | Kuo et al. |
| 2024/0063142 | A1 | 2/2024 | Elsherbini et al. |
| 2024/0153840 | A1 | 5/2024 | Jeng et al. |
| 2024/0222215 | A1 | 7/2024 | Chen et al. |
| 2025/0349642 | A1 | 11/2025 | Wang et al. |

OTHER PUBLICATIONS

Extended European Search Report from European Patent Application No. 23185988.5 notified Jan. 22, 2024, 22 pgs.

Jani, I., et al., “Innovative structures to test bonding alignment and characterize high density interconnects in 3D-IC”, 15th IEEE International New Circuits and Systems Conference (NEWCAS), 2017, pp. 153-156.

Bischof, David et al., “Laser-assisted etching of borosilicate glass in potassium hydroxide,” Optical Materials Express, vol. 11, No. 4, Apr. 1, 2021, 11 pgs.

Liu, Xue-Qing et al., “Etching-assisted femtosecond laser modification of hard materials,” 2019 Institute of Optics and 2 Electronics, Chinese Academy of Sciences, vol. 2, No. 9, pp. 190021-1-190021-14.

* cited by examiner 400
431
430
430
451
452
z
y x

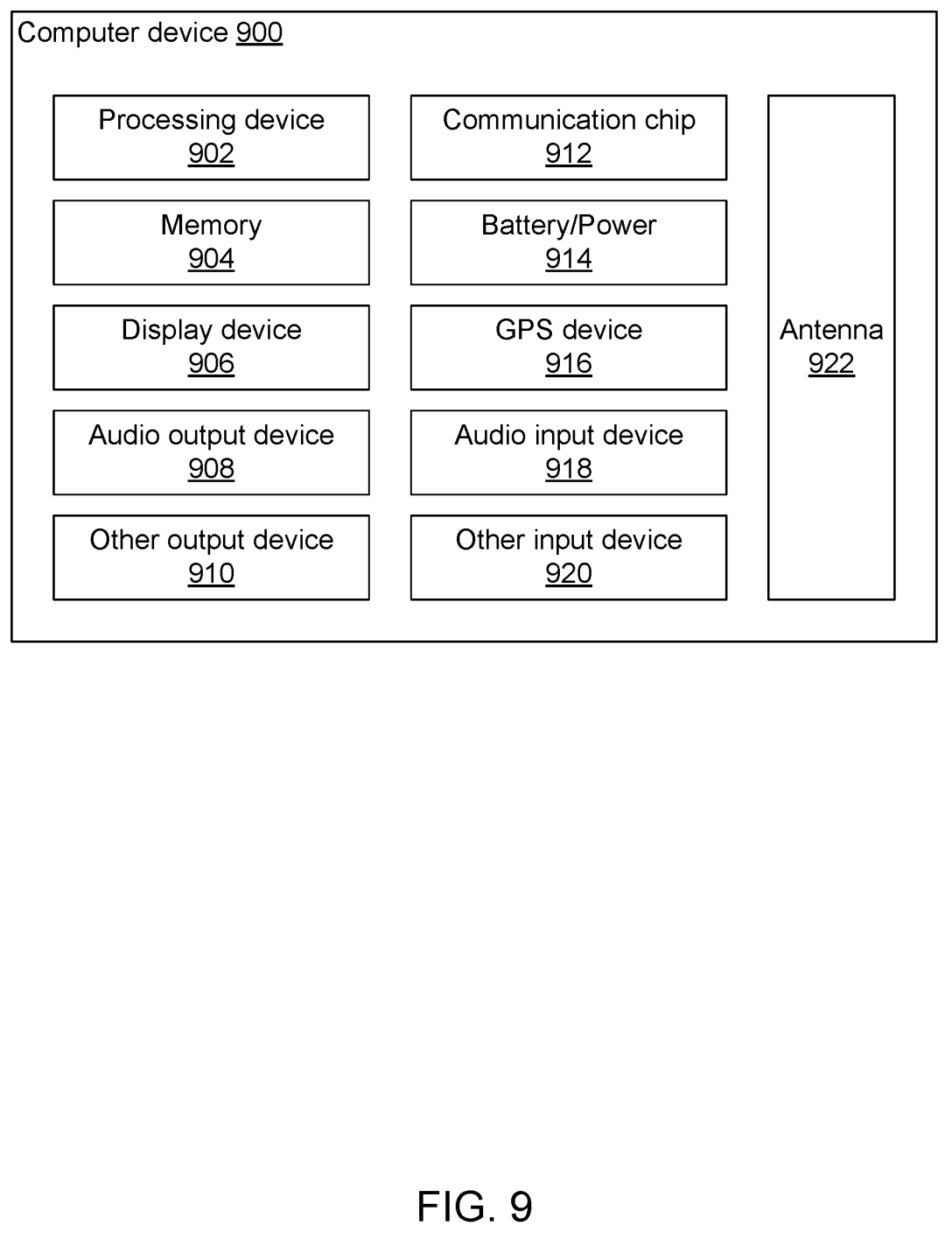

Computer device 900

Processing device 902

Memory 904

Display device 906

Audio output device 908

Other output device 910

Communication chip 912

Battery/Power 914

GPS device 916

Audio input device 918

Other input device 920

Antenna 922

FIG. 9

DEVICE, METHOD, AND SYSTEM TO MITIGATE WARPAGE OF A COMPOSITE CHIPLET

BACKGROUND

1. Technical Field

This disclosure generally relates to integrated circuit devices and more particularly, but not exclusively, to structures which mitigate warpage of a composite chiplet.

2. Background Art

Monolithic integrated circuit (IC) fabrication has restrictions that may limit a final product's performance, and thus different versions of IC integration are being investigated. To date however, these techniques and architectures generally suffer from certain drawbacks such as high cost, lower insertion efficiency, and increased z-height.

Some IC integration techniques are performed at the package level. In electronics manufacturing, IC packaging is a stage of semiconductor device fabrication in which an IC that has been monolithically fabricated on a chip (or die) comprising a semiconducting material is assembled into a "package" that can protect the IC chip from physical damage and support electrical contacts that connect the IC to a scaled host component, such as a printed circuit board. Multiple chips can be assembled, for example, into a multi-chip package (MCP). Such multi-chip packages may advantageously combine IC chips from heterogeneous silicon processes and/or combine small dis-aggregated chips from the same silicon process. However, there are many challenges with integrating multiple IC chips into such a chip-scale unit. For example, MCP packaging depends on connecting the different IC chips through package routing, or through interposer routing. However, such packaging interconnect suffers from latency and energy efficiency limitations. MCP technology is also currently limited to a relatively small number of die-to-die electrical connections (~50-2000 IO/mm of die edge, or about 2 K-80 K connections for an exemplary 10 mm×10 mm die).

Wafer-level stacking is another IC integration technique in which wafers of monolithically fabricated ICs are bonded together. While capable of supporting many more electrical connections (e.g., up to 4 million connections for a 10 mm×10 mm die at 5 μm), wafer-level stacking typically requires IC dies that are substantially the same size (area or footprint), and also suffers compounded yield loss since two dies at a same location within a wafer stack need to be functional. Wafer stacking also typically relies on through substrate vias (TSVs) to support signaling and power between die. TSVs are expensive and have a relatively low density, which can pose a bottleneck in power and/or signal delivery.

Die stacking is another IC integration technique where singulated IC die are stacked after all the metallization layers in the separate IC dies have been completed. Die stacking enables high flexibility since the dies can be individually tested and only known good dies are attached to each other. However, die attach is performed after the thickest chip metallization layers have been fabricated, and such layers do not support very fine pitches. The density of interconnects between the stacked die may therefore be limited. Furthermore, one of the IC chips typically still needs to support TSVs, further limiting interconnect densities across the stack interface.

BRIEF DESCRIPTION OF THE DRAWINGS

The various embodiments of the present invention are illustrated by way of example, and not by way of limitation, in the figures of the accompanying drawings and in which:

FIGS. 4A through 4H show cross-sectional views each illustrating features during a respective stage of processing which provides structures to mitigate warpage of a composite chiplet according to an embodiment.

FIG. 9 shows a functional block diagram illustrating features of a computer device comprising a composite chiplet according to an embodiment.

DETAILED DESCRIPTION

Figure 1A:
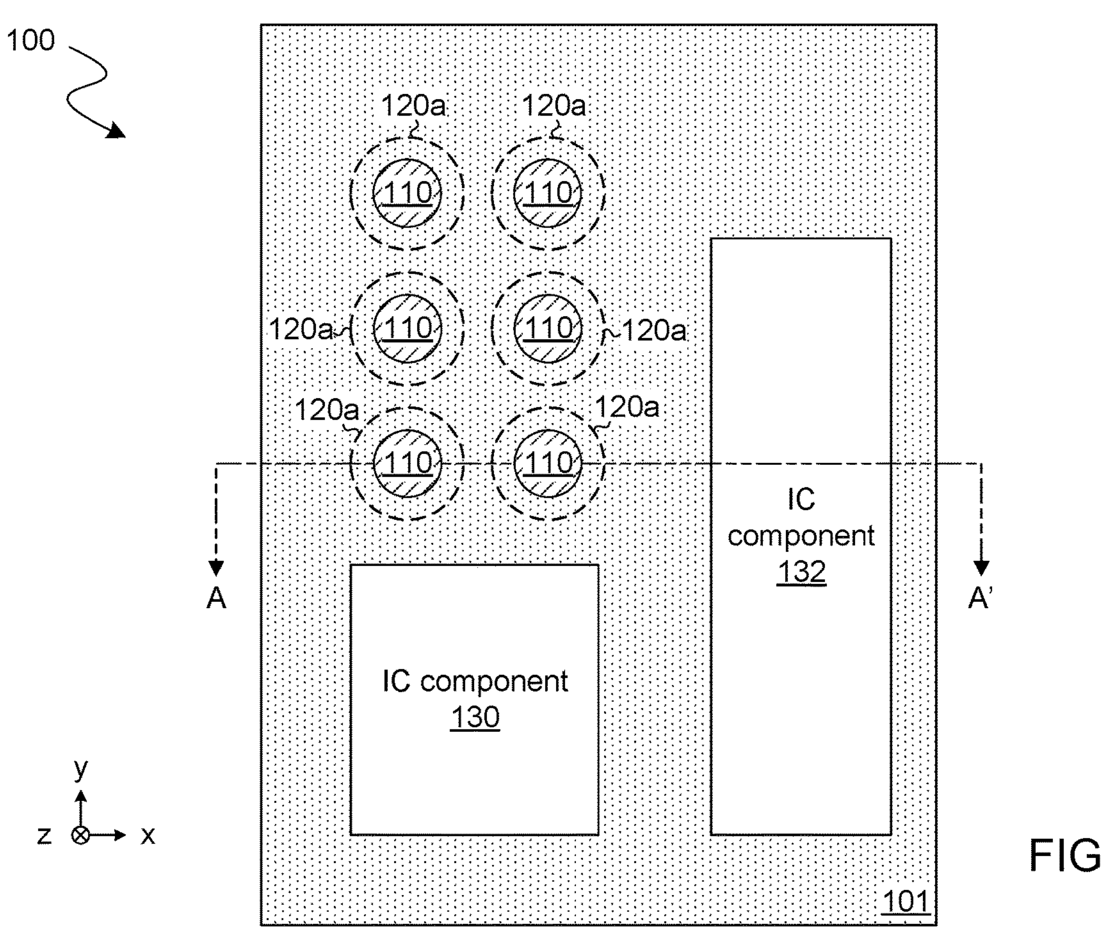
FIGS. 1A, 1B show cross-sectional views each illustrating features of a composite chiplet which includes or is coupled to warpage mitigation structures according to an embodiment.

Embodiments described herein variously provide techniques and/or mechanisms to mitigate the warping of a composite chiplet. For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

Advances in semiconductor processing and logic design have permitted an increase in the amount of logic circuits that may be included in processors and other IC devices. As a result, many processors now have multiple cores that are monolithically integrated on a single die. Generally, these types of monolithic ICs are also described as planar since they take the form of a flat surface and are typically built on a single silicon wafer made from a monocrystalline silicon boule. The typical manufacturing process for such monolithic ICs is called a planar process, allowing photolithography, etching, heat diffusion, oxidation, and other such processes to occur on the surface of the wafer, such that active circuit elements (e.g., transistors and diodes) are formed on the planar surface of the silicon wafer.

Current technologies permit hundreds and thousands of such active circuit elements to be formed on a single die so that numerous logic circuits may be enabled thereon. In such monolithic dies, the manufacturing process must be optimized for all the circuits equally, resulting in trade-offs between different circuits. In addition, because of the limitation of having to place circuits on a planar surface, some circuits are farther apart from some others, resulting in decreased performance such as longer delays. The manufacturing yield may also be severely impacted because the entire die may have to be discarded if even one circuit is malfunctional.

One solution to overcome such negative impacts of monolithic dies is to disaggregate the circuits into smaller chiplets electrically coupled by interconnect bridges. The term "chiplet" is used herein to refer to a die that is part of an assembly of interconnected dies forming a complete IC in terms of application and/or functionality, such as a memory chip, microprocessor, microcontroller, commodity IC (e.g., chip used for repetitive processing routines, simple tasks, application specific IC, etc.), and system-on-a-chip (SoC). In other words, the chiplets are individual dies connected together to create the functionalities of a monolithic IC. By using separate chiplets, each individual chiplet can be designed and manufactured optimally for a particular functionality. For example, a processor core that contains logic circuits might aim for performance, and thus might require a very speed-optimized layout. This has different manufacturing requirements compared to a USB controller, which is built to meet certain USB standards, rather than for processing speed. Thus, by having different parts of the overall design separated into different chiplets, each one optimized in terms of design and manufacturing, the overall yield and cost of the combined chiplet solution may be improved.

The connectivity between these chiplets is achievable by many different ways. For example, in 2.5D packaging solutions, a silicon interposer and Through Silicon Vias (TSVs) connect dies at silicon interconnect speed in a minimal footprint. In another example, called Embedded Multi-Die Interconnect Bridge (EMIB), a silicon bridge embedded under the edges of two interconnecting dies facilitates electrical coupling between them. In a three-dimensional (3D) architecture, the chiplets are stacked one above the other, creating a smaller footprint overall. Typically, the electrical connectivity and mechanical coupling in such 3D architecture is achieved using TSVs and high pitch solder-based bumps (e.g., C2 interconnections). The EMIB and the 3D stacked architecture may also be combined using an omni-directional interconnect (ODI), which allows for top-packaged chips to communicate with other chips horizontally using EMIB and vertically, using Through Mold Vias (TMVs) which are typically larger than TSVs. However, these current interconnect technologies use solder or its equivalent for connectivity, with consequent low vertical and horizontal interconnect density.

One way to mitigate low vertical interconnect density is to use an interposer, which improves vertical interconnect density but suffers from low lateral interconnect density if the base wafer of the interposer is passive. In a general sense, an "interposer" is commonly used to refer to a base piece of silicon that interconnects two dies. By including active circuitry in the interposer, lateral speeds may be improved, but it requires more expensive manufacturing processes, in particular when a large base die is used to interconnect smaller dies. Additionally, not all interfaces require fine pitch connections which may lead to additional manufacturing and processing overheads without the benefits of the fine pitch.

In one aspect of the present disclosure, an example of quasi-monolithic hierarchical integration of semiconductor dies includes recursively coupling a plurality of chiplets to form composite chiplets of a processing system. The plurality of chiplets may comprise active chiplets and/or passive chiplets, and at least a portion of the plurality of chiplets are coupled using hybrid direct interconnects. As used herein, "hybrid direct bonds" comprise die-to-die (DTD) interconnects with sub 10 micrometer pitch. In other words, the separation between any two hybrid direct bonds is less than or equal to 10 micrometer.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices. The term "circuit" means one or more passive and/or active components that are arranged to cooperate with one another to provide a desired function. The term "interconnect" may be used to describe any element formed of an electrically conductive material for providing electrical connectivity to one or more components associated with an IC or/and between various such components. In general, the "interconnect" may refer to both conductive traces (also sometimes referred to as "lines") and conductive vias. In general, in context of interconnects, the term "conductive trace" may be used to describe an electrically conductive element isolated by an insulator material (e.g., a low-k dielectric material) that is provided within the plane of an IC die. Such traces are typically stacked into several levels, or several layers, of metallization stacks. On the other hand, the term "via" may be used to describe an electrically conductive element that interconnects two or more traces of different levels. To that end, a via may be provided substantially perpendicularly to the plane of an IC die and may interconnect two traces in adjacent levels or two traces in not adjacent levels. A term "metallization stack" may be used to refer to a stack of one or more interconnects for providing connectivity to different circuit components of an IC chip. Sometimes, traces and vias may be referred to as "conductive traces" and "conductive vias", respectively, to highlight the fact that these elements include electrically conductive materials such as metals.

Interconnects as described herein, in particular interconnects of the IC structures as described herein, may be used for providing electrical connectivity to one or more components associated with an IC or/and between various such components, where, in various embodiments, components associated with an IC may include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer. In another example, the terms "package" and "IC package" are synonymous, as are the terms "die" and "IC die," the term "insulating" means "electrically insulating," the term "conducting" means "electrically conducting," unless otherwise specified.

In yet another example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide.

The terms "substantially," "close," "approximately," "near," and "about," generally refer to being within +/−20% of a target value (e.g., within +/−5 or 10% of a target value) based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers. In addition, the term "dispose" as used herein refers to position, location, placement, and/or arrangement rather than to any particular method of formation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. When used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments. Further, the structures shown in the figures may take any suitable form or shape according to material properties, fabrication processes, and operating conditions.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Figure 1B:
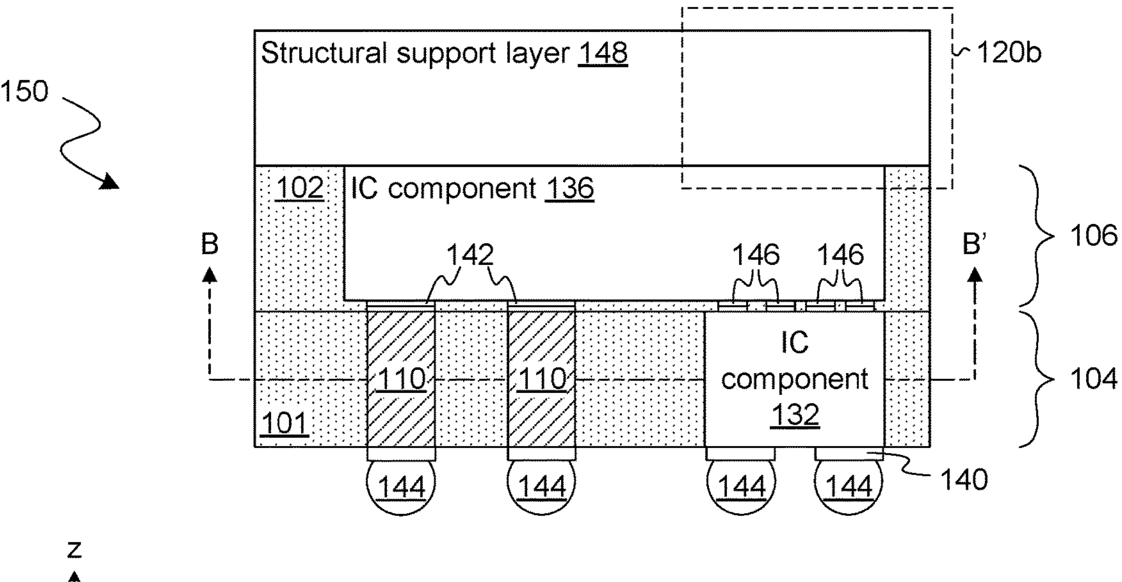

FIG. 1A, 1B shows features of a composite chiplet 100 which comprises warpage mitigation structures according to an embodiment. More particularly, FIG. 1A shows structures of composite chiplet 100 which are in a horizontal (x-y plane) cross-section BB', whereas FIG. 1B shows a cross-sectional view 150 of composite chiplet 100 in a vertical (z-x plane) section AA'. The composite chiplet 100 illustrates one example of an embodiment wherein one or more interconnect structures extend through a layer of a dielectric material, and wherein additional structures are provided to mitigate warpage of composite chiplet 100.

Composite chiplet 100 comprises a plurality of circuit blocks. As used herein, the term "circuit block" refers to an intellectual property (IP) block (also called IP core) comprising an abstract circuit of a reusable unit of logic, cell, or IC layout design with a particular functionality. For example, one or more circuit blocks of composite chiplet 100 each comprise a respective one or more of a set of memory registers, an arithmetic logic unit (ALU), a power converter, a local interconnect block, a global interconnect block and/or the like. However, some embodiments are not limited to a particular one or more functionalities which are to be provided with a given circuit block. A portion of the plurality of circuit blocks may function together as a processing element (PE) in some embodiments. Such a processing element may comprise, for example, some or all of a memory block, an ALU, and a power converter, along with a local interconnect blocks and a global interconnect block.

In various embodiments, composite chiplet 100 facilitates one or more composite PEs, which (for example) can be combined together to form a larger computing structure, which in turn may be further combined to form a larger number of cores. Local interconnect blocks may provide logical coupling between circuit blocks in the same PE, such as between a memory block and an ALU, or between a power converter and an ALU, or between different portions of the ALU. A global interconnect block may provide logical coupling between circuit blocks in different PEs.

In the example embodiment illustrated by FIG. 1A, 1B, one or more circuit blocks and/or processing elements of composite chiplet 100 are provided with IC components 130, 132, 136, which are variously located in two or more levels (e.g., including the illustrative first level 104 and second level 106 shown). In an embodiment, IC components 130, 132, 136 are variously fabricated (partially or fully) separately from each other—e.g., wherein IC components 130, 132 and 136 are then singulated each from a respective wafer, and variously transferred into position for inclusion in composite chiplet 100. The particular number and/or arrangement of IC components 130, 132, 136 is merely illustrative, and composite chiplet 100 alternatively includes more or fewer IC components in other embodiments—e.g., wherein composite chiplet 100 further comprises one or more additional levels below first level 104, and/or one or more additional levels above second level 106.

In some embodiments, one or more IC components 130, 132, 136 may comprise ultrasmall semiconductor dies called microchiplets with footprint less than 10 mm2. In some other embodiments, one or more IC components 130, 132, 136 may comprise semiconductor dies of any size. In yet other embodiments, one or more IC components 130, 132, 136 may comprise other composite chiplets in a recursive arrangement. In some embodiments, one or more IC components 130, 132, 136 may comprise a plurality of semiconductor dies stacked one on top of another, electrically coupled with hybrid direct bonds.

In some embodiments (e.g., as shown), a PE is embodied as a portion of composite chiplet 100. In other embodiments, multiple PEs are embodied each in a separate composite chiplet 100. In the example embodiment shown, first circuit blocks may be embodied in separate dies comprising IC components 130, 132 located at first level 104—e.g., wherein a second one or more circuit blocks may be embodied in a die comprising IC component 136 located at second level 106.

Any suitable combination, layout, configuration, or arrangement of various circuit blocks and processing elements (and corresponding IC components such as IC components 130, 132, 136) may be used within the broad scope of the embodiments of the present disclosure. For example, multiple such composite chiplets may be stacked within a single package. composite chiplet 100 may comprise an IC, such as a microprocessor, in some embodiments.

In other embodiments, composite chiplet 100 may form a portion (e.g., system controller block) of a larger IC, such as a microprocessor, a central processing unit (CPU), a memory device, e.g., a high-bandwidth memory device, a logic circuit, input/output circuitry, a transceiver such as a field programmable gate array transceiver, a gate array logic such as a field programmable gate array logic, of a power delivery circuitry, a III-V or a III-N device such as a III-N or III-N amplifier (e.g., GaN amplifier), Peripheral Component Interconnect Express circuitry, Double Data Rate transfer circuitry, or other electronic components known in the art In the example embodiment shown, IC components 130, 132 are variously disposed in a layer of an insulator 101 of first level 104, wherein IC component 136 is disposed in a layer of an insulator 102 of second level 106. Insulator 101 and/or insulator 102 comprise any of various suitable inorganic (or other) materials the provide electrical insulation. Examples of such materials include, but not limited to, silicon, silicon dioxide, silicon nitride, silicon carbide, or any of various combinations thereof. In one such embodiment, a (z-axis) thickness of insulator 101—or of insulator 102—is in a range of 5-80 microns (um), for example.

Signal and/or power to circuitry of a given IC component in one level of composite chiplet 100 may be routed through one or more conductive via structures (referred to herein as "through-connections") that extend through an insulator layer of another level. For example, through-connections 110 of composite chiplet 100 each illustrate a type of via structure (also referred to herein as a "through dielectric via", or "TDV") which extends to facilitate electrical connectivity through a level of a composite chiplet or other such quasi-monolithic chip structure. In the example embodiment shown, through-connections 110 variously extend through insulator 101 to provide electrical connectivity between IC component 136 (or other circuit structures of second level 106) and a respective one of various bond pads 140 which are at a bottom side of first level 104. For example, hybrid bonds (or other suitable electrical coupling) between through-connections 110 and IC component 136 are provided with bond pads 142—e.g., wherein other hybrid bonds between IC component 132 and IC component 136 are provided with bond pads 146. In one such embodiment, bond pads 140 facilitate coupling of composite chiplet 100 to an underlying organic substrate, circuit board, or other suitable device—e.g., via the illustrative microbumps 144 shown. In an alternative embodiment, bond pads 140 facilitate hybrid bonds (or other suitable electrical coupling) between first level 104 and another level (not shown) of composite chiplet 100.

Through-connections 110 comprise any of various suitable conductive materials including, but not limited to, copper (Cu), aluminum (Al), cobalt (Co), tin (Sn), titanium (Ti), or any of various combinations thereof. A given one of through-connections 110 has a cross-sectional profile—in a horizontal (x-y) plane—which, for example, is substantially circular, elliptical, rectangular or square. By way of illustration and not limitation, a given one of through-connections 110 has a radius (in an x-y plane) which is in a range of 0.5 to 9 um. In various embodiments, a given one of through-connections 110 includes, or adjoins, a surrounding barrier layer, or other liner structure (not shown) which, for example, comprises tantalum, titanium, titanium, titanium nitride, silicon dioxide, silicon nitride, or any of various other suitable materials. The particular number and arrangement of through-connections 110 is merely illustrative—e.g., wherein other embodiments include more, fewer, and/or differently arranged TDVs in first level 104, in second level 106 or in another level (not shown) of composite chiplet 100.

Note that FIGS. 1A, 1B are intended to show relative arrangements of the components within their assemblies, and that, in general, such assemblies may include other components that are not illustrated (e.g., various interfacial layers or various other components related to optical functionality, electrical connectivity, or thermal mitigation). For example, in some further embodiments, the assembly as shown in FIGS. 1A, 1B may include multiple dies and/or XPUs along with other electrical components.

Additionally, although some components of the assemblies are illustrated in FIGS. 1A, 1B as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

Some embodiments are based on a realization by the inventors that various types of composite chiplets are subject to potential distortion due at least in part to thermal expansion characteristics (and/or other physical properties) of via structures—such as through-connections 110—which extend through an insulator material which surrounds a chiplet or other such IC component. For example, distortion is often due to one or more metals of a TDV having a different (e.g., greater) thermal expansion coefficient than that of the surrounding insulator layer through which the TDV extends. Additionally or alternatively, distortion is due to stress buildup from the metal deposition processing which forms the TDV, and/or a subsequent thermal annealing processing which causes microstructural changes in the metal. To prevent or otherwise mitigate such distortion, these embodiments variously provide additional structures ("warpage mitigation structures" or "warp mitigation structures" herein)—e.g., including structures in some or all of the regions 120*a* shown, and/or structures in a region (such as the illustrative region 120*b* shown) of a structural support layer 148 which is disposed on levels 104, 106.

By way of illustration and not limitation, various embodiments provide, for each of one or more TDVs, a corresponding annular structure which surrounds said TDV. For a given one such annular structure, a transfer of compression stress or tensile stress—due to expansion or contraction of the corresponding TDV—is prevented or otherwise mitigated by the annular structure. For example, a solid material (if any) in the annular structure has greater elasticity, as compared to that of the insulator material through which the TDV extends. In one such embodiment, an annular structure includes a cavity region—e.g., wherein the interior of the annular structure has a gas (such as air) therein, or is otherwise substantially devoid of solid material. In another embodiment, the annular structure has disposed therein a material—such as a polymeric material, a porous dielectric, or the like—which has a lower modulus of elasticity (e.g., a Young's modulus) than that of the insulator layer.

Figure 2:
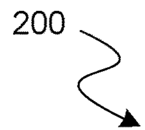
FIG. 2 shows a flow diagram illustrating features of a method for providing structures to mitigate warpage of a composite chiplet according to an embodiment.
Figure 2:
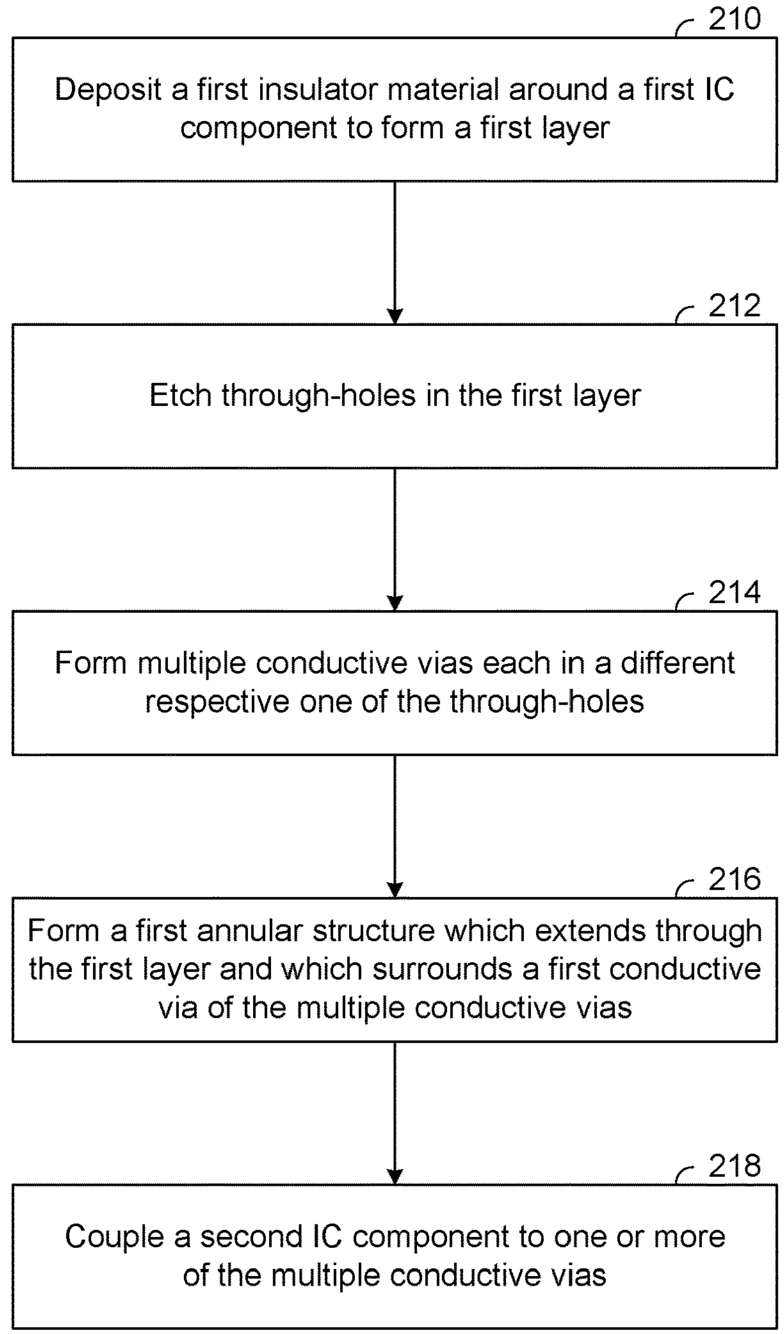

FIG. 2 shows features of a method 200 provide structures of a composite chiplet according to an embodiment. In various embodiments, method 200 is performed to provide structures such as those of composite chiplet 100. To illustrate certain features of various embodiments, method 200 is described herein with reference to composite chiplets 300, 500 which are variously shown in FIGS. 3A, 3B and 5, and with reference to structures provided during processing which is illustrated in FIGS. 4A-4H. However, in other embodiments, method 200 is performed to provide any of various other structures, as described herein.

As shown in FIG. 2, method 200 comprises (at 210) depositing a first insulator material—e.g., an inorganic oxide (or other) dielectric such as silicon dioxide—around an integrated circuit (IC) component to form a first layer. For example, the depositing at 210 includes any of various suitable vapor deposition (or other) processes to form insulator 101, in an embodiment. Method 200 further comprises (at 212) etching through-holes in the first layer which is formed at 210. Afterward (at 214), method 200 performs a metallization process to form multiple conductive vias which are each in a different respective one of the through-holes.

For example, FIG. 4A through 4G show features during respective stages 400 through 407 of processing to provide structures of a composite chiplet according to an embodiment. In various embodiments, processing such as that illustrated by stages 400 through 407 include some or all of method 200 (for example) and/or is performed to provide structures such as those of one of composite chiplets 100, 300.

Figures 4A, 4B, 4C, 4D:
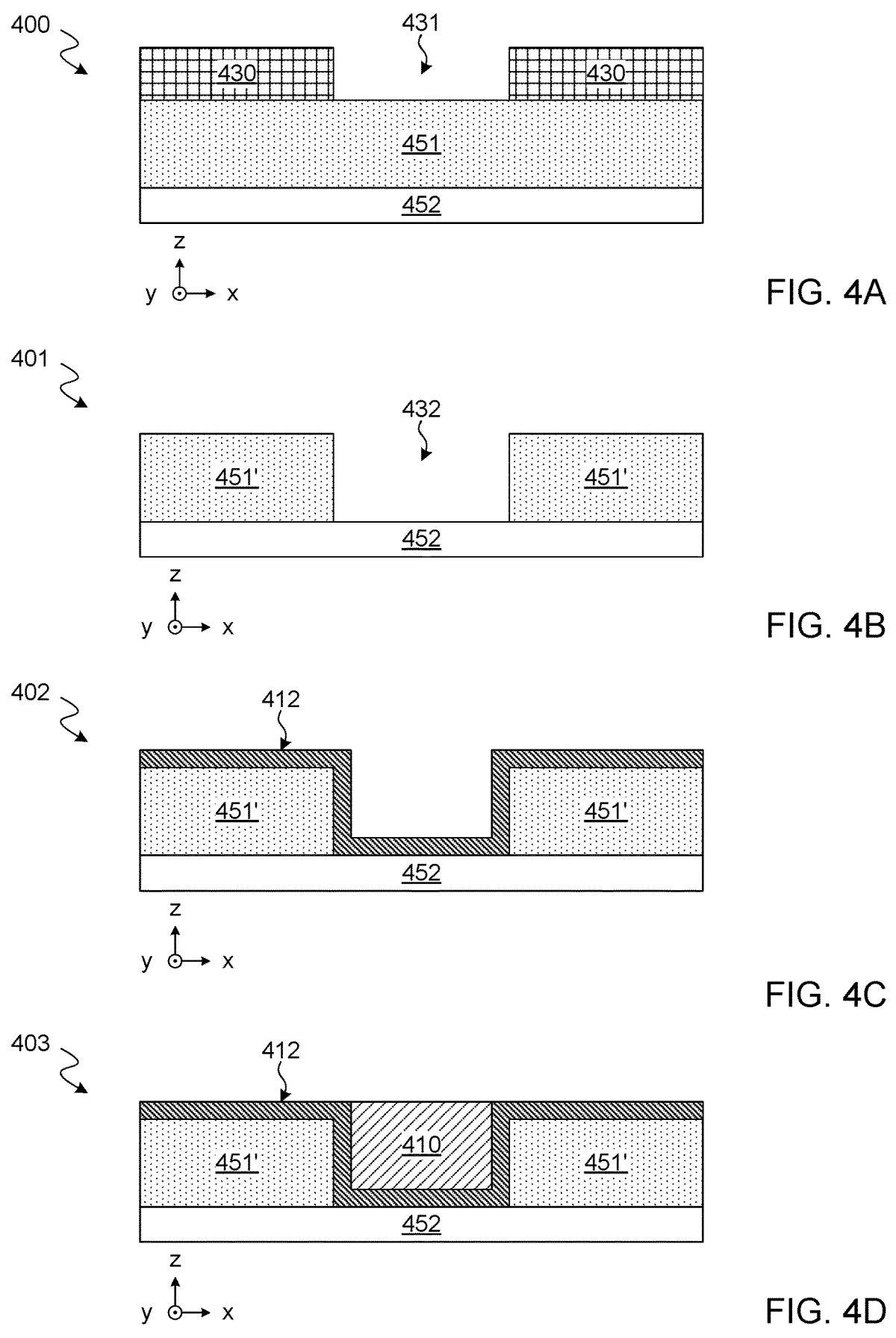

As shown in FIG. 4A, during stage 400, a patterned mask 430 is formed—e.g., by operations adapted from conventional lithography processes—on an insulator layer 451 which is on an underlying structure (illustrated by substrate 452) such as a carrier wafer, an underlying level of the composite chiplet, or the like. The patterned mask 430 has formed therein a gap 431 to accommodate etching of insulator layer 451. Subsequently, at the stage 401 shown in FIG. 4B, an etching of insulator layer 451 results in a modified insulator layer 451' which has formed therein a through-hole 432.

After removal of patterned mask 430, at the stage 402 shown in FIG. 4C, a liner structure 412 is formed—e.g., by any of various suitable vapor deposition processes—on surfaces of through-hole 432 and (in some embodiments) on a top surface of insulator layer 451'. In an embodiment, liner 412 comprises tantalum (Ta), titanium (Ti), or any of various other suitable metals which are adapted, for example, from conventional via fabrication techniques. In another embodiment, liner 412 comprises SiN, SiCN, $SiO_2$, TiN or any of various other suitable dielectrics that, for example, have a relatively low modulus of elasticity (as compared to that of insulator layer 451').

At the stage 403 shown in FIG. 4D, a sequence of lithographic, metallization, planarization and/or other operations results in the formation of a conductive via structure 410 on the portion of liner structure 412 which is in through-hole 432. Subsequently, as shown by the stage 404 in FIG. 4E, another patterned mask 433 is formed over various portions of conductive via structure 410 and liner structure 412. The patterned mask 433 has formed therein various gaps to accommodate etching of conductive via structure 410, liner structure 412, and/or insulator layer 451'.

Referring again to FIG. 2, method 200 (at 216) forms a first annular structure which extends through the insulator layer. In an embodiment, the first annular structure formed at 216 extends through the first layer, and surrounds a first conductive via of the multiple conductive vias.

Figures 4E, 4F, 4G, 4H:
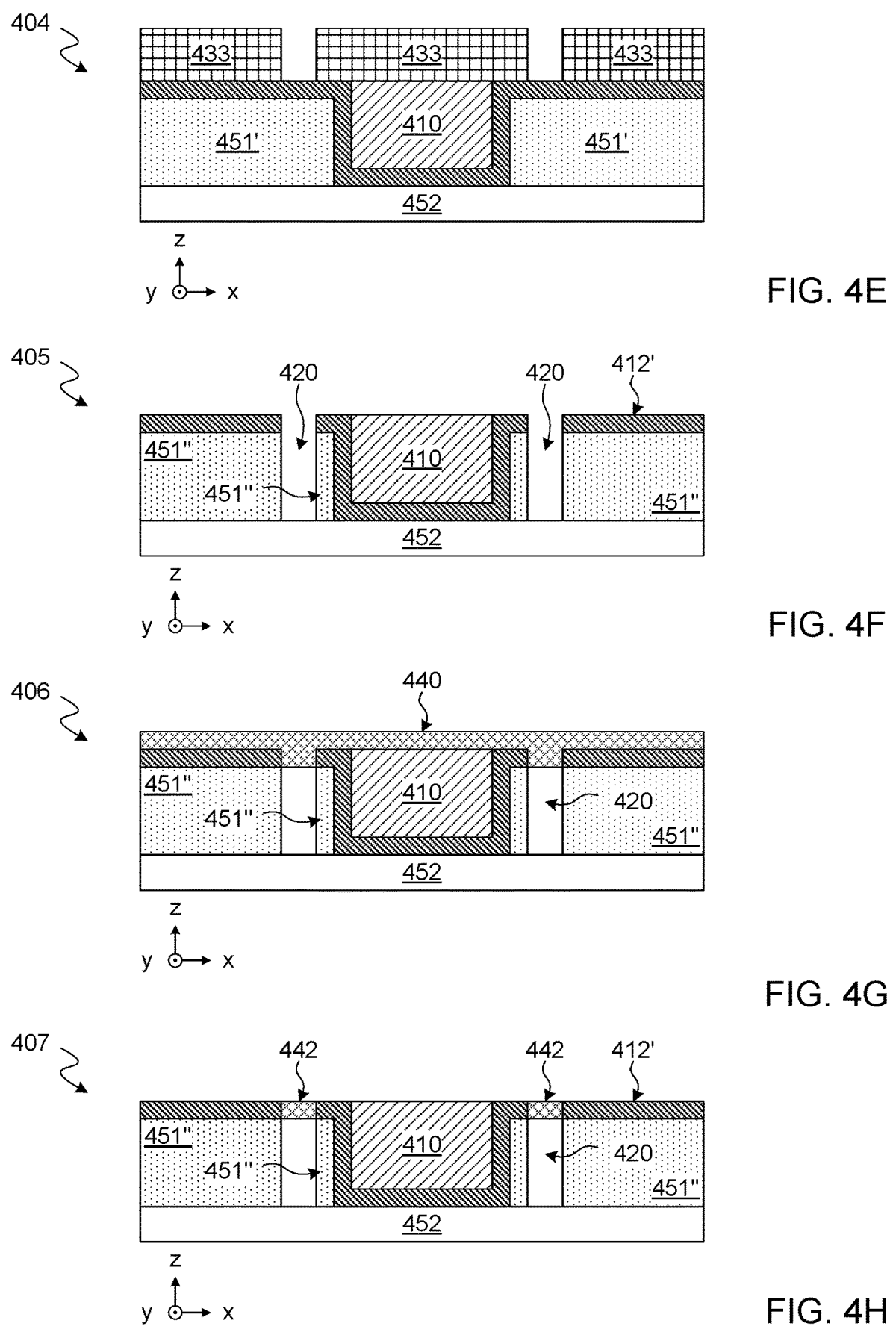

For example, referring again to the processing illustrated by FIGS. 4A-4H, at the stage 405 shown in FIG. 4F, an etching of insulator layer 451' results in the formation of an annular structure 420 which extends through a modified liner structure 412' and a modified insulator layer 451". In an embodiment, the annular structure 420 extends around conductive via structure 410—and, for example, around portions of annular structure 420'—in a horizontal (x-y) plane. Although some embodiments are not limited in this regard, a portion of insulator layer 451" is also surrounded by annular structure 420.

Afterward, at the stage 406 shown in FIG. 4G, a layer of dielectric 440 is formed—e.g., by an isotropic deposition process—over portions of conductive via structure 410 and liner structure 412'. In an embodiment, the layer of dielectric 440 facilitates the formation of a cap to prevent any later deposition of a solid into a cavity formed in annular structure 420. For example, at the stage 407 shown in FIG. 4H, planarization and/or other subtractive processing is performed to remove portions of dielectric 440, wherein another such portion remains as a cap structure 442 over annular structure 420.

Referring again to FIG. 2, the first annular structure formed at 216 mitigates a transfer of stress, such as compression stress or tensile stress which is due at least in part to an expansion or contraction of the first conductive via. In one such embodiment, a cavity region is in the first annular structure (e.g., wherein a majority of the total volume of the annular structure is devoid of any solid).

Figure 3A:
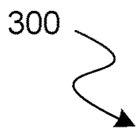
FIGS. 3A, 3B show cross-sectional views illustrating features of a composite chiplet which comprises warpage mitigation structures according to a corresponding embodiment.
Figure 3A:
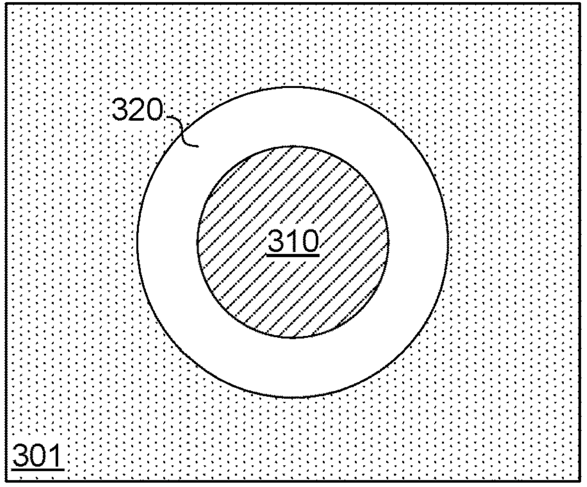
Figure 3B:
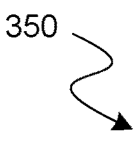
Figure 3B:
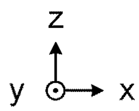
Figure 3B:
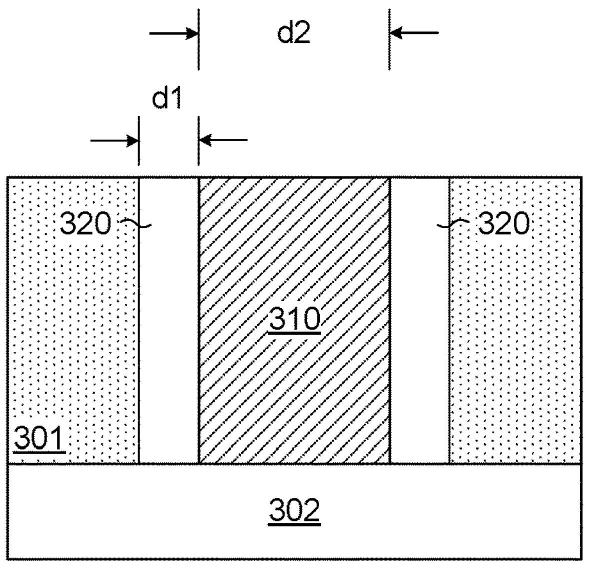

For example, referring now to FIGS. 3A, 3B, a composite chiplet 300 according to one embodiment comprises a layer of an insulator 301 (such as insulator 101 in the first level 104 of composite chiplet 100). Another cross-sectional view 350 of composite chiplet 300, in a vertical (x-z) plane, is shown in FIG. 3B. A through-connection 310 of composite chiplet 300 extends through insulator 301 from an underlying structure—represented by the illustrative layer 302 shown—such as a lower level of composite chiplet 300 and/or a bond pad or other suitable structure which facilitates electrical coupling with through-connection 310. In an embodiment, through-connection 310 (such as one of through-connections 110) is to be used to facilitate electrical coupling with an IC component in another level (not shown) of composite chiplet 300.

To mitigate warpage due to expansion or contraction of through-connection 310, composite chiplet 300 further comprises an annular structure 320 which extends vertically (along the z-axis) through insulator 301, and which surrounds through-connection 310 in a horizontal (x-y) plane. In the example embodiment shown, annular structure 320 is substantially devoid of any solid—e.g., wherein most of the total volume of annular structure 320 contains air or another gas. In an illustrative scenario according to one embodiment, a horizontal thickness d1 (e.g., an average minimum thickness) of annular structure 320 is in a range of 0.5 um to 2 um—e.g., wherein a diameter d2, or other cross-section of through-connection 310 is in a range of 1 um to 20 um.

Referring again to FIG. 2, the first annular structure formed at 216 alternatively comprises (in some embodiments) another material, different than the insulator material, which has a lower modulus of elasticity than that of the insulator material.

Figure 5A:
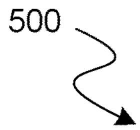
FIGS. 5A, 5B show cross-sectional views illustrating features of a composite chiplet which comprises warpage mitigation structures according to a corresponding embodiment.
Figure 5A:
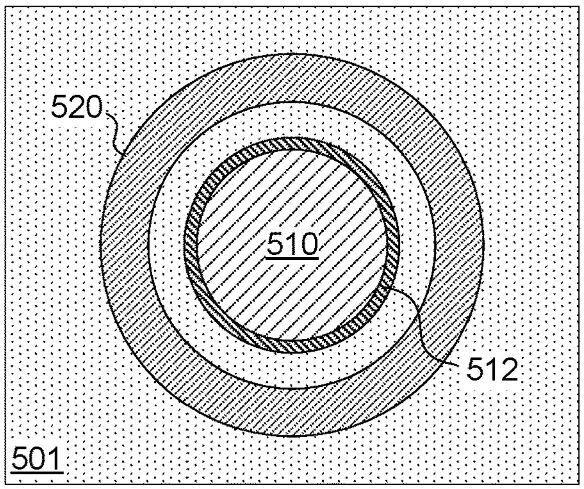
Figure 5B:
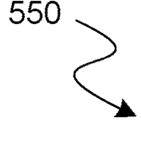
Figure 5B:
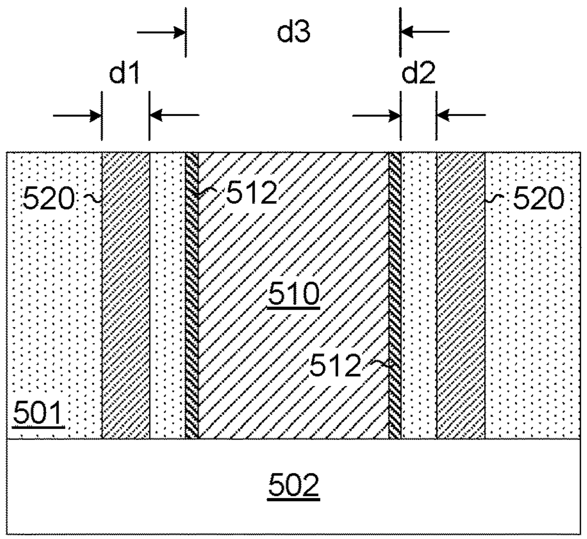
Figure 5B:
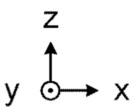

For example, referring now to FIG. 5A, a composite chiplet 500 according to another embodiment comprises a layer of an insulator 501 (such as insulator 101 in the first level 104 of composite chiplet 100). Another cross-sectional view 550 of composite chiplet 500, in a vertical (x-z) plane, is shown in FIG. 5B. A through-connection 510 of composite chiplet 500 extends through insulator 501 from an underlying structure, which is represented by the illustrative layer 502 shown. In an embodiment, through-connection 510 (such as one of through-connections 110) facilitates electrical coupling with an IC component in another level (not shown) of composite chiplet 500.

In the example embodiment shown, a liner 512—e.g., a seed layer, a barrier layer, or the like—is disposed around through-connection 510. By way of illustration and not limitation, liner 512 comprise any of various suitable dielectrics—such as SiN, SiCN, $SiO_2$, TiN—which, for example, are adapted from conventional composite chiplet fabrication techniques. In another embodiment, liner 512 comprises any of various suitable metals such as tantallum (Ta), titanium (Ti), or the like. Although some embodiments are not limited in this regard, a modulus of elasticity of liner 512 is in a range of 50 GPa to 200 GPa (for example). In other embodiments, composite chiplet 500 omits liner 512—e.g., wherein annular structure 520, or a portion of through-connection 510 (the portion surrounded by annular structure 520), adjoins through-connection 510.

To mitigate warpage due to expansion or contraction of through-connection 510, composite chiplet 500 further comprises an annular structure 520 which extends vertically (along the z-axis) through insulator 501, and which surrounds through-connection 510 in a horizontal (x-y) plane. In the example embodiment shown, annular structure 520 comprises a material which has a lower modulus of elasticity than that of insulator 501. By way of illustration and not limitation, the material in annular structure 520 is a soft polymeric material, such as any of various photoresist materials adapted from conventional fabrication techniques. In another embodiment, the material in annular structure 520 is any of various suitable low-k porous dielectrics—such as a carbon doped $SiO_2$, for example. In various embodiment, a modulus of elasticity of the material in annular structure 520 is in a range of 0.1 GPa to 10 GPa (for example).

In an illustrative scenario according to one embodiment, a horizontal thickness d1 (e.g., an average minimum thickness) of annular structure 520 is in a range of 1 um to 20 um. Alternatively or in addition, a horizontal distance d2 (e.g., an average minimum distance) between liner 512 and annular structure 520 is in a range of 1 um to 10 um—e.g., wherein a diameter d3, or other cross-section of through-connection 510 is in a range of 1 um to 20 um. However, the example values of d1, d2 and d3 are merely illustrative, and not limiting on some embodiments.

Referring again to FIG. 2, in various embodiments, a first level of a composite chiplet formed with method 200 is to comprise the first layer of the insulator material, as well as the first IC component, the multiple conductive vias, and the first annular structure. In one such embodiment, method 200 further comprises (at 218) coupling a second IC component to one or more of the multiple conductive vias, wherein a second level of the composite chiplet—such as level 106—is to comprise the second IC component.

Figure 6:
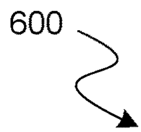
FIG. 6 shows a flow diagram illustrating features of a method for providing a structural support layer for mitigating warpage of a composite chiplet according to an embodiment.
Figure 6:
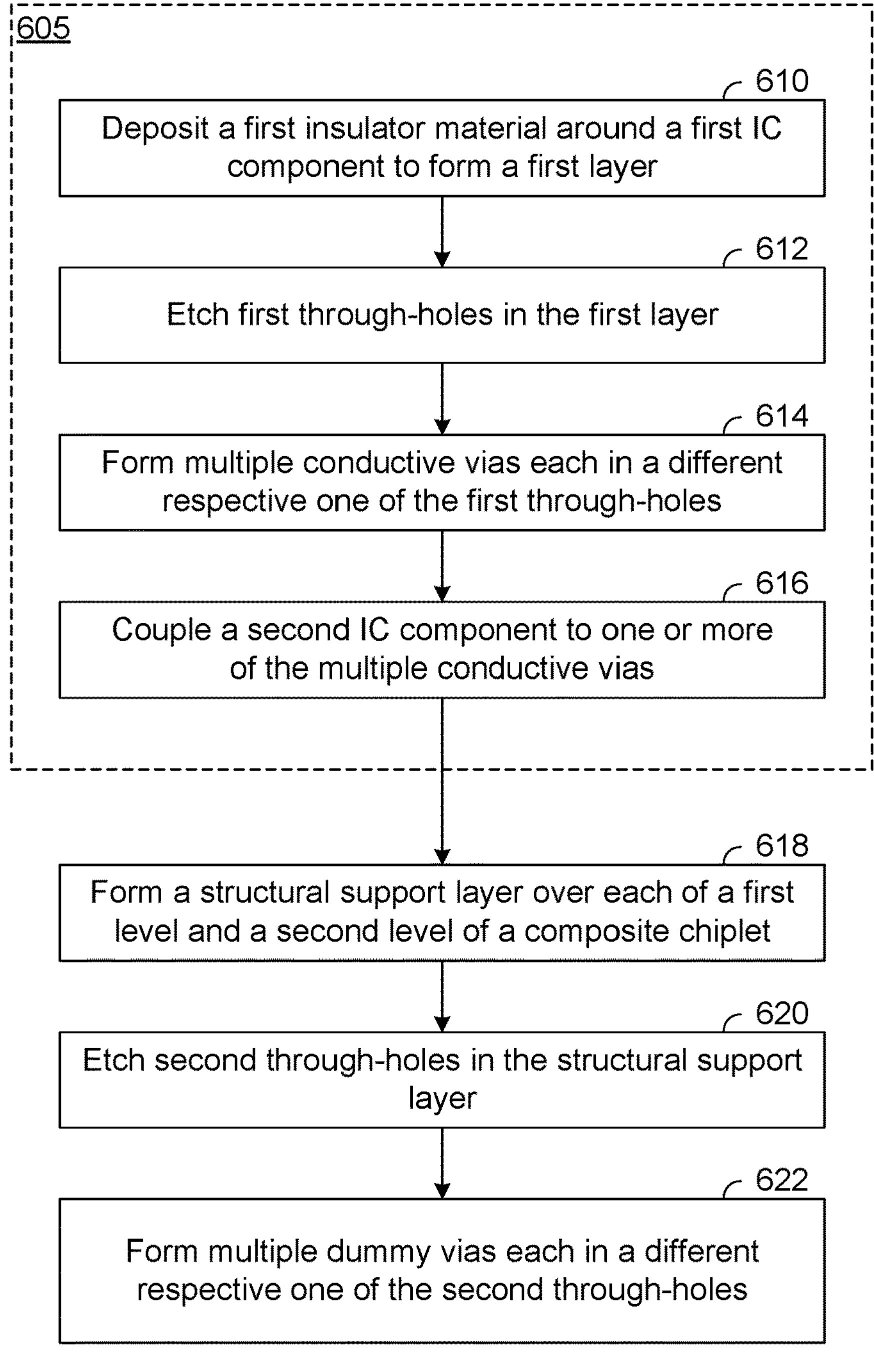

FIG. 6 shows features of a method 600 provide structures of a composite chiplet according to an embodiment. In various embodiments, method 600 forms some or all of one of the composite chiplets 100, 300, 400, 500—e.g., wherein method 600 includes or is otherwise based on operations of method 200.

In some embodiments, method 600 comprises operations 605 to fabricate one or more underlying levels of the composite chiplet—e.g., wherein said one or more levels include TDV structures which are a potential source of warp stresses. In other embodiments, method 600 instead omits operations 605, and instead simply receives said one or more underlying levels for additional fabrication processing.

As shown in FIG. 6, operations 605 comprise (at 610) depositing a first insulator material—e.g., an inorganic oxide (or other) dielectric such as silicon dioxide—around a first integrated circuit (IC) component to form a first layer (such as a layer of insulator 101).

In an embodiment, operations 605 further comprise (at 612) etching first through-holes in the first layer which is formed at 610. Afterward (at 614), operations 605 perform a metallization process to form a multiple conductive vias which are each in a different respective one of the first through-holes. A first level of the composite chiplet which is formed by operations 605 is to comprise the first layer, the first IC component, and the multiple conductive vias. In an embodiment, operations 605 further comprise (at 616) coupling a second IC component to one or more of the multiple conductive vias, wherein a second level of the composite chiplet is to comprise the second IC component.

In the example embodiment shown, method 600 comprises (at 618) forming a structural support layer over each of a first level and a second level of a composite chiplet. Subsequently (at 620), method 600 etches second through-holes in the structural support layer, and (at 622) performs metallization processing to form multiple dummy vias each in a different respective one of the second through-holes. For example, the multiple dummy vias comprise (for example) copper, aluminum, cobalt, tin, titanium, or any of various other suitable metals. Additionally or alternatively, the multiple conductive vias and the multiple dummy vias each comprise the same metal. In one embodiment, a total number of all dummy vias which extend through the structural support layer is greater than a total number of all conductive vias which extend through the first layer.

In some embodiments, method 600 further comprises additional operations (not shown) to deposit a warpage compensation film on a top surface of the structural support layer—e.g., wherein a thickness of the film is less than 50 microns. In one such embodiment, a first modulus of elasticity of the structural support layer is less than a second modulus of elasticity of the film. An example of one such warpage compensation film is described herein with reference to FIG. 7B.

Figure 7A:
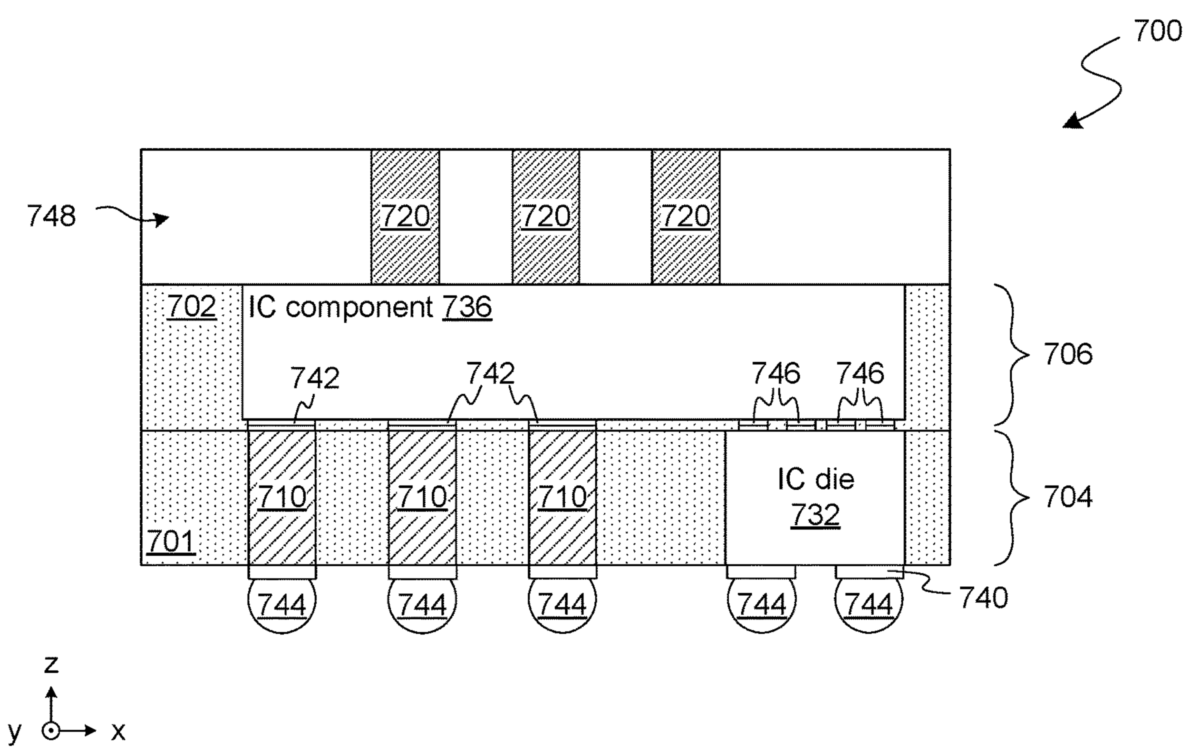
FIGS. 7A, 7B show cross-sectional views illustrating features of respective devices each to mitigate warpage of a composite chiplet according to a corresponding embodiment.

FIG. 7A shows features of a composite chiplet 700 which provides warpage mitigation structures according to an embodiment. Composite chiplet 700 illustrates one example of an embodiment wherein dummy vias variously extend through a structural support layer to compensate at least in part for warpage due to the expansion or contraction of TDVs. In some embodiments, composite chiplet 700 has features of composite chiplet 100 (for example), and/or is provided at least in part by operations of method 600.

As shown in FIG. 7A, composite chiplet 700 comprises multiple IC components (e.g., including multiple chiplets) which are variously located each in a respective one of multiple levels of composite chiplet 700. For example, IC component 732 is located in a first level 704, and another IC component 736 is located in a second level 706 over first level 704—e.g., wherein IC components 732, 736 correspond functionally to IC components 132, 136 (respectively). IC component 732 is disposed in (and extends vertically through) a layer of an insulator 701 of first level 704, wherein IC component 736 is disposed in a layer of an insulator 702 of second level 706. In an embodiment, insulator 701 and insulator 702 have respective features of insulator 101 and insulator 102 (for example).

One or more through-dielectric via structures of composite chiplet 700 variously extend vertically each through a respective one of levels 704, 706 (or any other such level of composite chiplet 700). By way of illustration and not limitation, through-connections 710 variously extend through insulator 701 to provide electrical connectivity between IC component 736 and a respective one of various bond pads 740 which are at a bottom side of first level 704. Hybrid bonds (for example) between through-connections 710 and IC component 736 are provided with bond pads 742—e.g., wherein other hybrid bonds between IC component 732 and IC component 736 are provided with bond pads 746. In one such embodiment, bond pads 740 facilitate coupling of composite chiplet 700 to an underlying organic substrate, circuit board, or other suitable device—e.g., via the illustrative microbumps 744 shown. In an alternative embodiment, bond pads 740 facilitate hybrid bonds (or other suitable electrical coupling) between first level 704 and another level (not shown) of composite chiplet 700—e.g., wherein microbumps 744 are omitted.

In one such embodiment, composite chiplet 700 further includes a structural support layer 748 which mitigates the possibility and/or degree of warpage (or other distortion) which would otherwise be caused due at least in part to thermal compression or contraction of through-connections 710 or other such TDV structures. Structural support layer 748 comprises any of various dielectric (or other materials) which, for example, are at least as inelastic as an insulator material such as one of insulators 701, 702. By way of illustration and not limitation, structural support layer 748 comprises silicon, silicon carbide, or any of various other suitable materials adapted (for example) from conventional stiffener structures. In one such embodiment, structural support layer 748 comprises silicon which is coated, for example, with one or more other materials such as copper, silicon nitride, aluminum nitride or the like. In one illustrative embodiment, a thickness (z-axis dimension) of structural support layer 748 is in a range of 80 microns (um) to 770 um.

To mitigate the effects of changing stresses—e.g., due to expansion or contraction of through-connections 710—composite chiplet 700 further comprises multiple dummy via structures 720 which variously extend vertically (along the z-axis) in structural support layer 748. As a result, whether composite chiplet 700 is subjected to increasing or decreasing temperatures, a distorting force caused by expansion or contraction of through-connections 710 will be countered at least in part by an opposite force caused by expansion or contraction of dummy via structures 720.

For example, in some embodiments, dummy via structures 720 comprise any of various suitable metals including, but not limited to, copper (Cu), aluminum (Al), cobalt (Co), tin (Sn), titanium (Ti) or any of various alloys or other combinations thereof. In one such embodiment, dummy via structures 720 and through-connections 710 comprise the same one or more metals—e.g., wherein through-connections 710 and dummy via structures 720 have the same chemical composition. Although some embodiments are not limited in this regard, a given one of dummy via structures 720 has a radius (or a cross-sectional area, for example) is substantially equal to a radius (or cross-sectional area) of one of through-connections 710. Additionally or alternatively, a total number of all of the dummy via structures 720 in structural support layer 748 is greater than a total number of all conductive vias which extend through the first layer 704. In some embodiments, composite chiplet 700 further comprises annular structures (not shown) which, for example, have features of one of the annular structures 320, 420, 520.

Figure 7B:
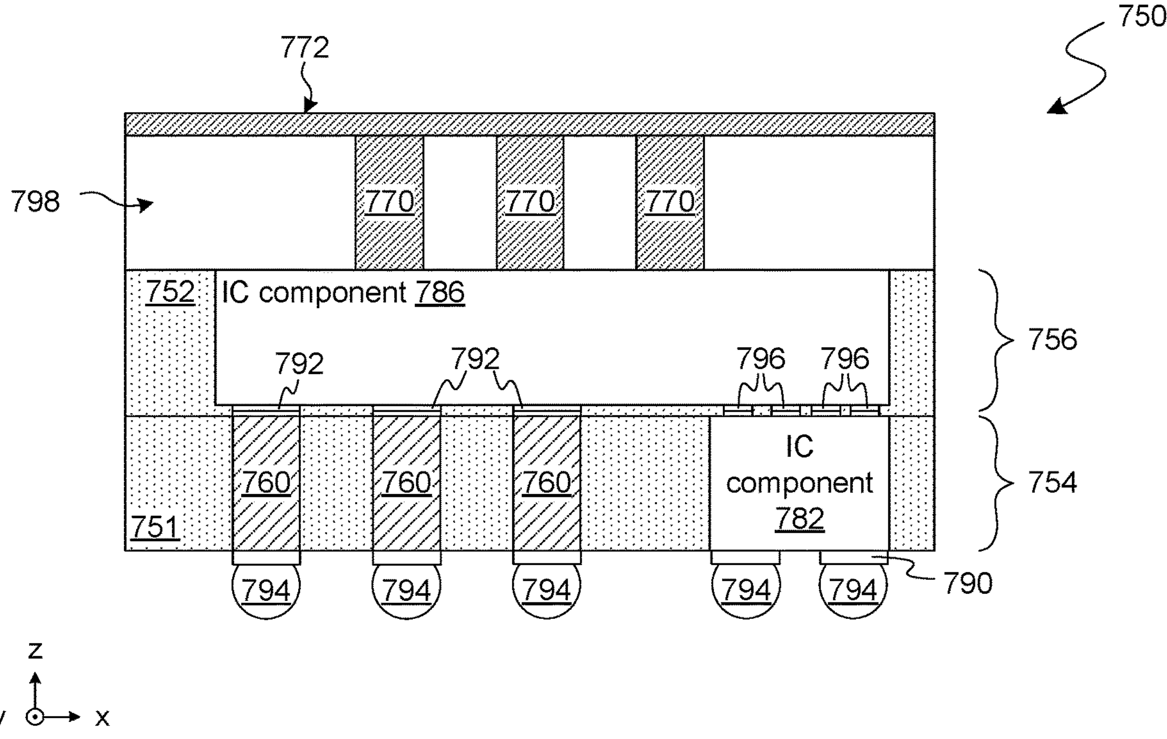

FIG. 7B shows features of a composite chiplet 750 which provides warpage mitigation structures according to another embodiment. Composite chiplet 750 illustrates one example of an embodiment wherein a structural support layer has disposed thereon (or includes) a relatively inelastic film to compensate at least in part for warpage due to the expansion or contraction of TDVs. In some embodiments, composite chiplet 700 has features of composite chiplet 100 (for example), and/or is provided at least in part by operations of method 600.

A shown in FIG. 7B, composite chiplet 750 comprises circuitry in various levels, including levels 754, 756 which correspond, for example, to levels 704, 706 (respectively). In one such embodiment, first level 704 comprises through-connections 760, an insulator 751, and an IC component 782 which (for example) correspond functionally to through-connections 710, insulator 701, and IC component 732, respectively. Furthermore, an IC component 786 in second level 706 provides functionality such as that of IC component 786—e.g., wherein bond pads 790, microbumps 794, and bond pads 792, 796 correspond functionally to bond pads 740, microbumps 744, and bond pads 742, 746 (respectively)

In one such embodiment, composite chiplet 700 further includes a structural support layer 798 which mitigates the possibility and/or degree of warpage (or other distortion) which would otherwise be caused due at least in part to thermal compression or contraction of through-connections 710 or other such TDV structures. By way of illustration and not limitation, structural support layer 798 has some or all of the features of structural support layer 748. In the example embodiment shown, structural support layer 798 has formed therein dummy via structures 770 which (for example) correspond functionally to dummy via structures 720. However, in other embodiments, structural support layer 798 omits such dummy via structures 770.

To further mitigate warpage of composite chiplet 700 structural support layer 798 includes (or has disposed thereon) a film structure—such as the illustrative compensation film 772 shown—which is relatively inelastic, as compared to the underlying material of structural support layer 798. As a result, whether composite chiplet 750 is subjected to increasing or decreasing temperatures, a distorting force caused by expansion or contraction of through-connections 760 will be countered at least in part by an opposite force caused by expansion or contraction of dummy via structures 770.

By way of illustration and not limitation, compensation film 772 comprises copper (Cu), aluminum (Al), cobalt (Co) or any of various other metals which are suitable to resist warping of the underlying levels 754, 756. Alternatively or in addition, compensation film 772 comprises any of various dielectrics including, but not limited to, silicon nitride (SiN), silicon carbonitride (SiCN), silicon dioxide ($SiO_2$), or the like. In various embodiments, a (z-axis) thickness of compensation film 772 is in a range of 1 um to 50 um. In some embodiments, composite chiplet 750 further comprises annular structures (not shown) which, for example, have features of one of the annular structures 320, 420, 520.

Figure 8:
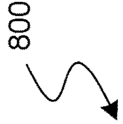
FIG. 8 shows a cross-sectional view illustrating features of an integrated circuit device assembly comprising a composite chiplet according to an embodiment.
Figure 8:
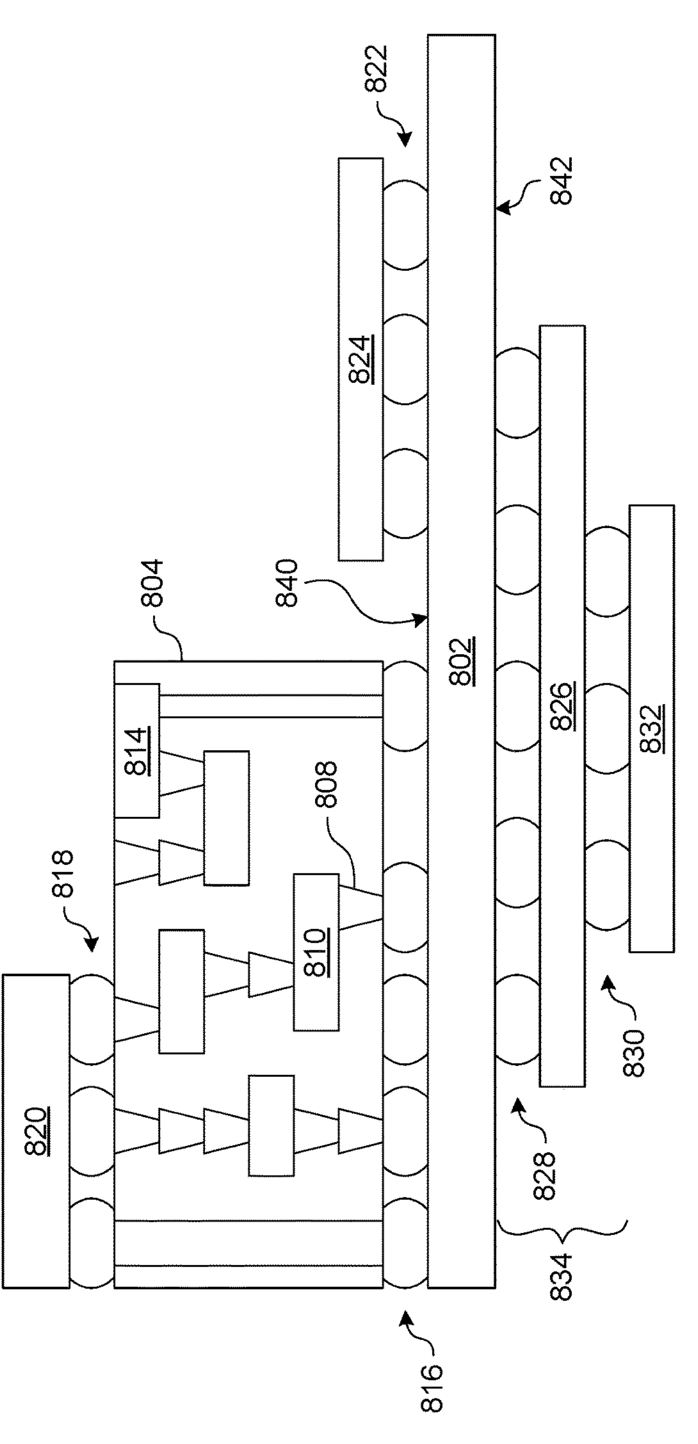

FIG. 8 is a cross-sectional side view of an IC device assembly 800 that may include a composite chiplet having one or more warpage mitigation structures in accordance with any of the embodiments disclosed herein. IC device assembly 800 includes a number of components disposed over a circuit board 802 (which may be, e.g., a motherboard). IC device assembly 800 includes components disposed over a first face 840 of circuit board 802 and an opposing second face 842 of circuit board 802; generally, components may be disposed over one or both faces 840 and 842. In particular, any suitable ones of the components of IC device assembly 800 may include any of the composite chiplets in accordance with any of the embodiments disclosed herein; e.g., any of the IC packages discussed below with reference to IC device assembly 800 may comprises one of composite chiplets 100, 300, 500, 700, 750.

In some embodiments, circuit board 802 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 802. In other embodiments, circuit board 802 may be a non-PCB package substrate.

As illustrated in the figure, in some embodiments, IC device assembly 800 may include a package-on-interposer structure 836 coupled to first face 840 of circuit board 802 by coupling components 816. Coupling components 816 may electrically and mechanically couple package-on-interposer structure 836 to circuit board 802, and may include solder balls (as shown), male and female portions of a socket, an adhesive, an underfill material, and/or any other suitable electrical and/or mechanical coupling structure.

Package-on-interposer structure 836 may include IC package 820 coupled to interposer 804 by coupling components 818. Coupling components 818 may take any suitable form depending on desired functionalities, such as the forms discussed above with reference to coupling components 816. In some embodiments, IC package 820 may include a composite chiplet having warpage mitigation structures such as those in one of composite chiplets 100, 300, 500, 700, 750. In some embodiments, IC package 820 may include at least one composite chiplet 100 as described herein. Composite chiplet 100 is not specifically shown in the figure in order to not clutter the drawing.

Although a single IC package 820 is shown in the figure, multiple IC packages may be coupled to interposer 804; indeed, additional interposers may be coupled to interposer 804. Interposer 804 may provide an intervening package substrate used to bridge circuit board 802 and IC package 820. Generally, interposer 804 may redistribute a connection to a wider pitch or reroute a connection to a different connection. For example, interposer 804 may couple IC package 820 to a BGA of coupling components 816 for coupling to circuit board 802.

In the embodiment illustrated in the figure, IC package 820 and circuit board 802 are attached to opposing sides of interposer 804. In other embodiments, IC package 820 and circuit board 802 may be attached to a same side of interposer 804. In some embodiments, three or more components may be interconnected by way of interposer 804.

Interposer 804 may be formed of an epoxy resin, a fiberglass-reinforced epoxy resin, a ceramic material, or a polymer material such as polyimide. In some implementations, interposer 804 may be formed of alternate rigid or flexible materials that may include the same materials described above for use in a semiconductor substrate, such as silicon, germanium, and other group III-V and group IV materials. Interposer 804 may include metal interconnects 808 and vias 810, including but not limited to TSVs 806. Interposer 804 may further include embedded devices 814, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on interposer 804. Package-on-interposer structure 836 may take the form of any of the package-on-interposer structures known in the art.

In some embodiments, IC device assembly 800 may include an IC package 824 coupled to first face 840 of circuit board 802 by coupling components 822. Coupling components 822 may take the form of any of the embodiments discussed above with reference to coupling components 816, and IC package 824 may take the form of any of the embodiments discussed above with reference to IC package 820.

In some embodiments, IC device assembly 800 may include a package-on-package structure 834 coupled to second face 842 of circuit board 802 by coupling components 828. Package-on-package structure 834 may include an IC package 826 and an IC package 832 coupled together by coupling components 830 such that IC package 826 is disposed between circuit board 802 and IC package 832. Coupling components 828 and 830 may take the form of any of the embodiments of coupling components 816 discussed above, and IC packages 826 and/or 832 may take the form of any of the embodiments of IC package 820 discussed above. Package-on-package structure 834 may be configured in accordance with any of the package-on-package structures known in the art.

FIG. 9 is a block diagram of an example computer device 900 that may include one or more components having one or more IC packages in accordance with any of the embodiments disclosed herein. For example, any suitable ones of the components of computer device 900 may include a microelectronic assembly with a composite chiplet (e.g., composite chiplet 100), in accordance with any of the embodiments disclosed herein. In another example, any one or more of the components of computer device 900 may include any embodiments of one of composite chiplets 100, 300, 500, 700, 750. In yet another example, any one or more of the components of computer device 900 may include an IC device assembly 800 (e.g., as shown in FIG. 8).

A number of components are illustrated in the figure as included in computer device 900, but any one or more of these components may be omitted or duplicated, as suitable for the application. In some embodiments, some or all of the components included in computer device 900 may be attached to one or more motherboards. In some embodiments, some or all of these components are fabricated onto a single system-on-a-chip (SoC) die.

Additionally, in various embodiments, computer device 900 may not include one or more of the components illustrated in the figure, but computer device 900 may include interface circuitry for coupling to the one or more components. For example, computer device 900 may not include a display device 906, but may include display device interface circuitry (e.g., a connector and driver circuitry) to which display device 906 may be coupled. In another set of examples, computer device 900 may not include an audio input device 918 or an audio output device 908, but may include audio input or output device interface circuitry (e.g., connectors and supporting circuitry) to which audio input device 918 or audio output device 908 may be coupled.

Computer device 900 may include a processing device 902 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 902 may include one or more digital signal processors (DSPs), ASICs, CPUs, GPUs, cryptoprocessors (specialized processors that execute cryptographic algorithms within hardware), server processors, or any other suitable processing devices. Computer device 900 may include a memory 904, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 904 may include memory that shares a die with processing device 902. This memory may be used as cache memory and may include embedded dynamic random access memory (eDRAM) or spin transfer torque magnetic random access memory (STT-MRAM).

In some embodiments, computer device 900 may include a communication chip 912 (e.g., one or more communication chips). For example, communication chip 912 may be configured for managing wireless communications for the transfer of data to and from computer device 900. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 912 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 912 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 912 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 912 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 912 may operate in accordance with other wireless protocols in other embodiments. Computer device 900 may include an antenna 922 to facilitate wireless communications and/or to receive other wireless communications (such as AM or FM radio transmissions).

In some embodiments, communication chip 912 may manage wired communications, such as electrical, optical, or any other suitable communication protocols (e.g., the Ethernet). As noted above, communication chip 912 may include multiple communication chips. For instance, a first communication chip 912 may be dedicated to shorter-range wireless communications such as Wi-Fi or Bluetooth, and a second communication chip 912 may be dedicated to longer-range wireless communications such as global positioning system (GPS), EDGE, GPRS, CDMA, WiMAX, LTE, EV-DO, or others. In some embodiments, a first communication chip 912 may be dedicated to wireless communications, and a second communication chip 912 may be dedicated to wired communications.

Computer device 900 may include battery/power circuitry 914. Battery/power circuitry 914 may include one or more energy storage devices (e.g., batteries or capacitors) and/or circuitry for coupling components of computer device 900 to an energy source separate from computer device 900 (e.g., AC line power).

Computer device 900 may include a display device 906 (or corresponding interface circuitry, as discussed above). Display device 906 may include any visual indicators, such as a heads-up display, a computer monitor, a projector, a touchscreen display, a liquid crystal display (LCD), a light-emitting diode display, or a flat panel display, for example.

Computer device 900 may include audio output device 908 (or corresponding interface circuitry, as discussed above). Audio output device 908 may include any device that generates an audible indicator, such as speakers, headsets, or earbuds, for example.

Computer device 900 may include audio input device 918 (or corresponding interface circuitry, as discussed above). Audio input device 918 may include any device that generates a signal representative of a sound, such as microphones, microphone arrays, or digital instruments (e.g., instruments having a musical instrument digital interface (MIDI) output).

Computer device 900 may include a GPS device 916 (or corresponding interface circuitry, as discussed above). GPS device 916 may be in communication with a satellite-based system and may receive a location of computer device 900, as known in the art.

Computer device 900 may include other output device 910 (or corresponding interface circuitry, as discussed above). Examples of other output device 910 may include an audio codec, a video codec, a printer, a wired or wireless transmitter for providing information to other devices, or an additional storage device.

Computer device 900 may include other input device 920 (or corresponding interface circuitry, as discussed above). Examples of other input device 920 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computer device 900 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computer device 900 may be any other electronic device that processes data.

In one or more first embodiments, a composite chiplet comprises a first integrated circuit (IC) component at a first level, a second IC component at a second level, a first layer of a first insulator material at the first level, wherein the first layer extends around the first IC component, a first conductive via which extends through the first layer and is electrically coupled to circuitry at the second level, and a first annular structure which extends through the first layer and which surrounds the first conductive via in the first layer, wherein a cavity region is in the first annular structure, or the first annular structure comprises a second material, wherein a first modulus of elasticity of the first insulator material is greater than a second modulus of elasticity of the second material.

In one or more second embodiments, further to the first embodiment, the first conductive via is one of multiple conductive vias which extend through the first layer, the first annular structure is one of multiple annular structures which each extend through the first layer and which each surround a respective one of the multiple conductive vias in the first layer, and for each one of the multiple annular structures a respective cavity region is in the annular structure, or the annular structure comprises the second material.

In one or more third embodiments, further to the second embodiment, each of the multiple annular structures surrounds only a respective one of the multiple conductive vias.

In one or more fourth embodiments, further to the first embodiment or the second embodiment, the first annular structure comprises the second material, and wherein the second material comprises a polymer.

In one or more fifth embodiments, further to any of the first embodiment or the second embodiment, the first annular structure comprises the second material, and wherein the second material comprises a low-k porous dielectric.

In one or more sixth embodiments, further to any of the first embodiment or the second embodiment, the first annular structure comprises the second material, and wherein the second of elasticity is in a range of 0.1 GigaPascals (GPa) to 10 GPa.

In one or more seventh embodiments, further to any of the first embodiment or the second embodiment, a portion of the insulator material is between the first conductive via and the annular structure.

In one or more eighth embodiments, further to any of the first embodiment or the second embodiment, the composite chiplet further comprises a structural support layer over the second level, wherein multiple dummy vias extend through the structural support layer.

In one or more ninth embodiments, further to the eighth embodiment, the composite chiplet further comprises a film on a top surface of the structural support layer, wherein a third modulus of elasticity of the structural support layer is less than a fourth modulus of elasticity of the film.

In one or more tenth embodiments, a method comprises depositing a first insulator material around a first integrated circuit (IC) component to form a first layer, etching through-holes in the first layer, forming multiple conductive vias each in a different respective one of the through-holes, forming a first annular structure which extends through the first layer and which surrounds a first conductive via of the multiple conductive vias, wherein a cavity region is in the first annular structure, or the first annular structure comprises a second material, wherein a first modulus of elasticity of the first insulator material is greater than a second modulus of elasticity of the second material, and coupling a second IC component to one or more of the multiple conductive vias, wherein a first level of a composite chiplet comprises the first layer, the first IC component, the multiple conductive vias, and the first annular structure, and wherein a second level of the composite chiplet comprises the second IC component.

In one or more eleventh embodiments, further to the tenth embodiment, the first annular structure is one of multiple annular structures which each extend through the first layer and which each surround a respective one of the multiple conductive vias in the first layer, for each one of the multiple annular structures a respective cavity region is in the annular structure, or the annular structure comprises the second material.

In one or more twelfth embodiments, further to the eleventh embodiment, each of the multiple annular structures surrounds only a respective one of the multiple conductive vias.

In one or more thirteenth embodiments, further to the tenth embodiment or the eleventh embodiment, the first annular structure comprises the second material, and wherein the second material comprises a polymer.

In one or more fourteenth embodiments, further to the tenth embodiment or the eleventh embodiment, the first annular structure comprises the second material, and wherein the second material comprises a low-k porous dielectric.

In one or more fifteenth embodiments, further to the tenth embodiment or the eleventh embodiment, the first annular structure comprises the second material, and wherein the second of elasticity is in a range of 0.1 GigaPascals (GPa) to 10 GPa.

In one or more sixteenth embodiments, further to the tenth embodiment or the eleventh embodiment, a portion of the insulator material is between the first conductive via and the annular structure.

In one or more seventeenth embodiments, further to the tenth embodiment or the eleventh embodiment, the method further comprises a structural support layer over the second level, wherein multiple dummy vias extend through the structural support layer.

In one or more eighteenth embodiments, further to the seventeenth embodiment, the method further comprises a film on a top surface of the structural support layer, wherein a third modulus of elasticity of the structural support layer is less than a fourth modulus of elasticity of the film.

In one or more nineteenth embodiments, a system comprises a microprocessor, and a memory coupled to the microprocessor, wherein at least one of the memory or the microprocessor comprises circuitry on a composite chiplet comprising a first integrated circuit (IC) component at a first level, a second IC component at a second level, a first layer of a first insulator material at the first level, wherein the first layer extends around the first IC component, a first conductive via which extends through the first layer and is electrically coupled to circuitry at the second level, and a first annular structure which extends through the first layer and which surrounds the first conductive via in the first layer, wherein a cavity region is in the first annular structure, or the first annular structure comprises a second material, wherein a first modulus of elasticity of the first insulator material is greater than a second modulus of elasticity of the second material.

In one or more twentieth embodiments, further to the nineteenth embodiment, the first conductive via is one of multiple conductive vias which extend through the first layer, the first annular structure is one of multiple annular structures which each extend through the first layer and which each surround a respective one of the multiple conductive vias in the first layer, and for each one of the multiple annular structures a respective cavity region is in the annular structure, or the annular structure comprises the second material.

In one or more twenty-first embodiments, further to the twentieth embodiment, each of the multiple annular structures surrounds only a respective one of the multiple conductive vias.

In one or more twenty-second embodiments, further to the nineteenth embodiment or the twentieth embodiment, the first annular structure comprises the second material, and wherein the second material comprises a polymer.

In one or more twenty-third embodiments, further to the nineteenth embodiment or the twentieth embodiment, the first annular structure comprises the second material, and wherein the second material comprises a low-k porous dielectric.

In one or more twenty-fourth embodiments, further to the nineteenth embodiment or the twentieth embodiment, the first annular structure comprises the second material, and wherein the second of elasticity is in a range of 0.1 GigaPascals (GPa) to 10 GPa.

In one or more twenty-fifth embodiments, further to the nineteenth embodiment or the twentieth embodiment, a portion of the insulator material is between the first conductive via and the annular structure.

In one or more twenty-sixth embodiments, further to the nineteenth embodiment or the twentieth embodiment, the composite chiplet further comprises a structural support layer over the second level, wherein multiple dummy vias extend through the structural support layer.

In one or more twenty-seventh embodiments, further to the twenty-sixth embodiment, the composite chiplet further comprises a film on a top surface of the structural support layer, wherein a third modulus of elasticity of the structural support layer is less than a fourth modulus of elasticity of the film.

In one or more twenty-eighth embodiments, a composite chiplet comprises a first integrated circuit (IC) component at a first level, a second IC component at a second level, a first layer of a first insulator material at the first level, wherein the first layer extends around the first IC component, a first plurality of conductive vias which extend through the first layer and are each electrically coupled to respective circuitry at the second level, and a structural support layer over the second level, wherein multiple dummy vias extend through the structural support layer.

In one or more twenty-ninth embodiments, further to the twenty-eighth embodiment, the multiple dummy vias comprise copper, aluminum, cobalt, tin, or titanium.

In one or more thirtieth embodiments, further to the twenty-eighth embodiment or the twenty-ninth embodiment, the multiple conductive vias and the multiple dummy vias each comprise a first metal.

In one or more thirty-first embodiments, further to any of the twenty-eighth through thirtieth embodiments, a total number of all dummy vias which extend through the structural support layer is greater than a total number of all conductive vias which extend through the first layer.

In one or more thirty-second embodiments, further to any of the twenty-eighth through thirty-first embodiments, the composite chiplet further comprises a film on a top surface of the structural support layer, wherein a first modulus of elasticity of the structural support layer is less than a second modulus of elasticity of the film.

In one or more thirty-third embodiments, further to the thirty-second embodiment, a thickness of the film is less than 50 microns.

In one or more thirty-fourth embodiments, a method comprises forming a structural support layer over each of a first level and a second level of a composite chiplet which comprises a first integrated circuit (IC) component at the first level, a second IC component at the second level, a first layer of a first insulator material at the first level, wherein the first layer extends around the first IC component, and a first plurality of conductive vias which extend through the first layer and are each electrically coupled to respective circuitry at the second level, etching through-holes in the structural support layer, and forming multiple dummy vias each in a different respective one of the through-holes.

In one or more thirty-fifth embodiments, further to the thirty-fourth embodiment, the multiple dummy vias comprise copper, aluminum, cobalt, tin, or titanium.

In one or more thirty-sixth embodiments, further to the thirty-fourth embodiment or the thirty-fifth embodiment, the multiple conductive vias and the multiple dummy vias each comprise a first metal.

In one or more thirty-seventh embodiments, further to any of the thirty-fourth through thirty-sixth embodiments, a total number of all dummy vias which extend through the structural support layer is greater than a total number of all conductive vias which extend through the first layer.

In one or more thirty-eighth embodiments, further to any of the thirty-fourth through thirty-seventh embodiments, the method further comprises depositing a film on a top surface of the structural support layer, wherein a first modulus of elasticity of the structural support layer is less than a second modulus of elasticity of the film.

In one or more thirty-ninth embodiments, further to the thirty-eighth embodiment, a thickness of the film is less than 50 microns.

In one or more fortieth embodiments, a system comprises a microprocessor, and a memory coupled to the microprocessor, wherein at least one of the memory or the microprocessor comprises circuitry on a composite chiplet comprising a first integrated circuit (IC) component at a first level, a second IC component at a second level, a first layer of a first insulator material at the first level, wherein the first layer extends around the first IC component, a first plurality of conductive vias which extend through the first layer and are each electrically coupled to respective circuitry at the second level, and a structural support layer over the second level, wherein multiple dummy vias extend through the structural support layer.

In one or more forty-first embodiments, further to the fortieth embodiment, the multiple dummy vias comprise copper, aluminum, cobalt, tin, or titanium.

In one or more forty-second embodiments, further to the fortieth embodiment or the forty-first embodiment, the multiple conductive vias and the multiple dummy vias each comprise a first metal.

In one or more forty-third embodiments, further to any of the fortieth through forty-second embodiments, a total number of all dummy vias which extend through the structural support layer is greater than a total number of all conductive vias which extend through the first layer.

In one or more forty-fourth embodiments, further to any of the fortieth through forty-third embodiments, the system further comprises a film on a top surface of the structural support layer, wherein a first modulus of elasticity of the structural support layer is less than a second modulus of elasticity of the film.

In one or more forty-fifth embodiments, further to the forty-fourth embodiment, a thickness of the film is less than 50 microns.

Techniques and architectures for mitigating warpage of a composite chiplet are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A composite chiplet comprising:
- a first integrated circuit (IC) component at a first level;
- a second IC component at a second level;
- a first layer of a first insulator material at the first level, wherein the first layer extends around the first IC component;
- a first conductive via which extends through the first layer and is electrically coupled to circuitry at the second level; and
- a first annular structure which extends through the first layer and which surrounds the first conductive via in the first layer, wherein:
  - a cavity region is in the first annular structure; or
  - the first annular structure comprises a second material, wherein a first modulus of elasticity of the first insulator material is greater than a second modulus of elasticity of the second material; and wherein:
- a contiguous body of the first insulator material of the first layer forms an entirety of a periphery of the first annular structure at the first level; and
- the first conductive via is an only conductive via to extend through the first annular structure.

2. The composite chiplet of claim 1, wherein:
- the first conductive via is one of multiple conductive vias which extend through the first layer;
- the first annular structure is one of multiple annular structures which each extend through the first layer and which each surround a respective one of the multiple conductive vias in the first layer; and
- for each one of the multiple annular structures:
  - a respective cavity region is in the annular structure; or
  - the annular structure comprises the second material.

3. The composite chiplet of claim 2, wherein each of the multiple annular structures surrounds only a respective one of the multiple conductive vias.

4. The composite chiplet of claim 1, wherein the first annular structure comprises the second material, and wherein the second material comprises a polymer.

5. The composite chiplet of claim 1, wherein the first annular structure comprises the second material, and wherein the second material comprises a low-k porous dielectric.

6. The composite chiplet of claim 1, wherein the first annular structure comprises the second material, and wherein the second modulus of elasticity is in a range of 0.1 GigaPascals (GPa) to 10 GPa.

7. The composite chiplet of claim 1, further comprising a structural support layer over the second level, wherein multiple dummy vias extend through the structural support layer.

8. The composite chiplet of claim 7, further comprising a film on a top surface of the structural support layer, wherein a third modulus of elasticity of the structural support layer is less than a fourth modulus of elasticity of the film.

9. A system comprising:
- a microprocessor; and
- a memory coupled to the microprocessor, wherein at least one of the memory or the microprocessor comprises circuitry on a composite chiplet comprising:
  - a first integrated circuit (IC) component at a first level;
  - a second IC component at a second level;
  - a first layer of a first insulator material at the first level, wherein the first layer extends around the first IC component;
  - a first conductive via which extends through the first layer and is electrically coupled to circuitry at the second level; and
  - a first annular structure which extends through the first layer and which surrounds the first conductive via in the first layer, wherein:
    - a cavity region is in the first annular structure; or
    - the first annular structure comprises a second material, wherein a first modulus of elasticity of the first insulator material is greater than a second modulus of elasticity of the second material; and wherein:
  - a contiguous body of the first insulator material of the first layer forms an entirety of a periphery of the first annular structure at the first level; and
  - the first conductive via is an only conductive via to extend through the first annular structure.

10. The system of claim 9, wherein:
- the first conductive via is one of multiple conductive vias which extend through the first layer;
- the first annular structure is one of multiple annular structures which each extend through the first layer and which each surround a respective one of the multiple conductive vias in the first layer; and
- for each one of the multiple annular structures:
  - a respective cavity region is in the annular structure; or
  - the annular structure comprises the second material.

11. The system of claim 9, wherein the first annular structure comprises the second material, and wherein the second material comprises a polymer.

12. The system of claim 9, wherein the first annular structure comprises the second material, and wherein the second material comprises a low-k porous dielectric.

13. The system of claim 9, wherein the composite chiplet further comprises a structural support layer over the second level, wherein multiple dummy vias extend through the structural support layer.

14. The system of claim 13, wherein the composite chiplet further comprises a film on a top surface of the structural support layer, wherein a third modulus of elasticity of the structural support layer is less than a fourth modulus of elasticity of the film.

* * * * *